(12) United States Patent  (10) Patent No.: US 7,739,058 B2
Maruyama  (45) Date of Patent: Jun. 15, 2010

(54) CONDITION-MONITORING DEVICE AND SWITCH-CONTROL DEVICE PROVIDED WITH THE SAME

(75) Inventor: Akihiko Maruyama, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 90 days.

(21) Appl. No.: 12/282,589

(22) PCT Filed: Mar. 17, 2006

(86) PCT No.: PCT/JP2006/305362

§ 371 (c)(1),
(2), (4) Date: Sep. 11, 2008

(87) PCT Pub. No.: WO2007/108063

PCT Pub. Date: Sep. 27, 2007

(65) Prior Publication Data

US 2009/0138212 A1    May 28, 2009

(51) Int. Cl.
*G01B 3/00*    (2006.01)
*G06F 19/00*    (2006.01)
(52) U.S. Cl. .......................... 702/34; 702/38; 702/115; 702/182
(58) Field of Classification Search ................... 702/34, 702/38, 115, 182
See application file for complete search history.

(56) References Cited

U.S. PATENT DOCUMENTS 4,680,562 A * 7/1987 Bratkowski et al. ........... 335/16
5,636,134 A    6/1997 Johnson et al.
6,111,741 A * 8/2000 Schmitz et al. ............. 361/143
6,208,497 B1 * 3/2001 Seale et al. .................. 361/160
6,249,418 B1 * 6/2001 Bergstrom .................. 361/152
6,285,151 B1 * 9/2001 Wright et al. ............... 318/560
6,657,847 B1 * 12/2003 Wright et al. ............... 361/160
2007/0222427 A1    9/2007 Takeuchi et al.

FOREIGN PATENT DOCUMENTS

| JP | 04-015324 | * | 1/1992 |
| JP | 11-356029 | * | 12/1999 |
| JP | 2 350 724 | | 12/2000 |
| JP | 2005 078971 | | 3/2005 |
| JP | 2005 223168 | | 8/2005 |
| JP | 2006 004902 | | 1/2006 |

* cited by examiner

*Primary Examiner*—Drew A Dunn
*Assistant Examiner*—Cindy H Khuu
(74) *Attorney, Agent, or Firm*—Oblon, Spivak, McClelland, Maier & Neustadt, L.L.P.

(57) ABSTRACT

A condition-monitoring device of the invention, which is provided in an electromagnetic actuator including a stationary core, a moving core, magnet coils; and a permanent magnet, monitors condition of the electromagnetic actuator. The condition-monitoring device includes a current measurement means for measuring a current flowing through the magnet coils; magnetic-flux measurement means for measuring magnetic flux inside the stationary core; a calculation means for generating a calculated waveform by performing a calculation using a current waveform representing a time variation of an output signal from the current measurement means and a magnetic-flux waveform representing a time variation of an output signal from the magnetic-flux measurement means; and a condition determination means, by finding a distinctive point on the calculated waveform, for determining conditions of the electromagnetic actuator based on information on the distinctive point.

7 Claims, 18 Drawing Sheets

FIG. 3
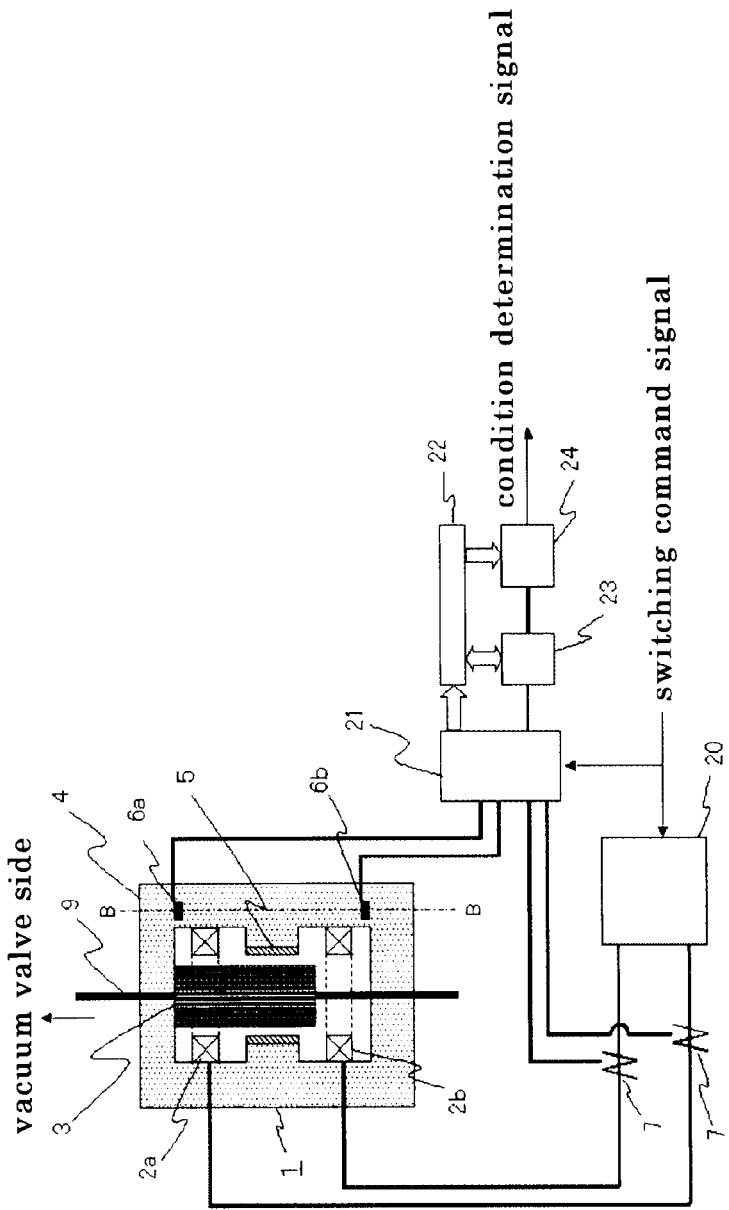
FIG. 3A
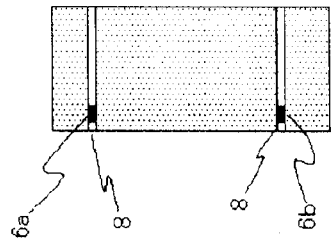
FIG. 3B

FIG. 7
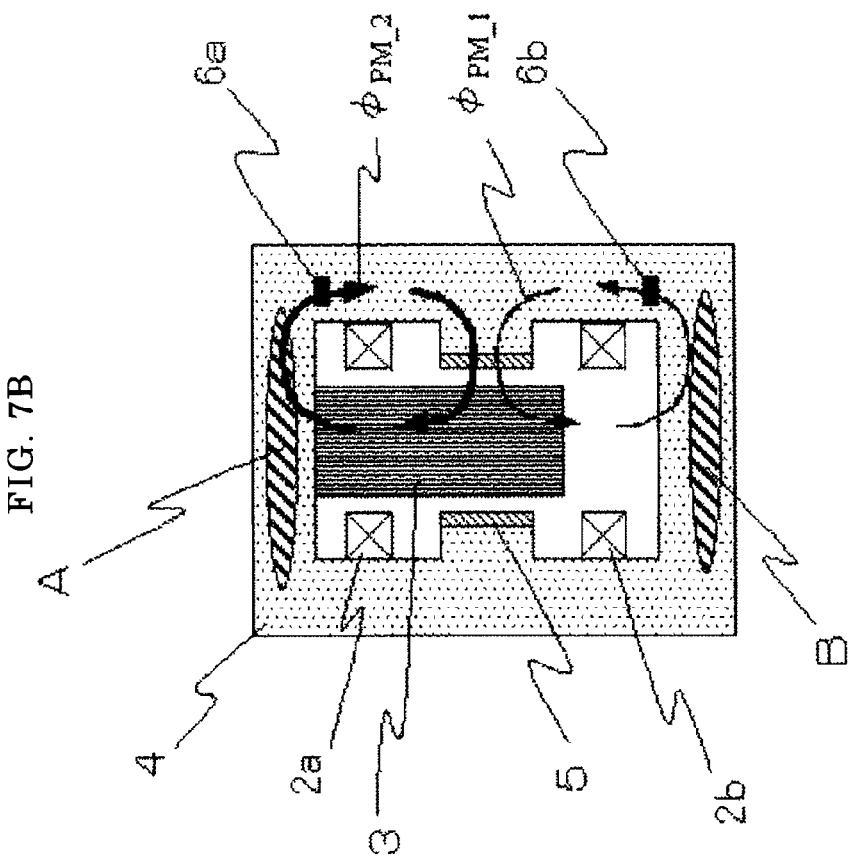
FIG. 7A
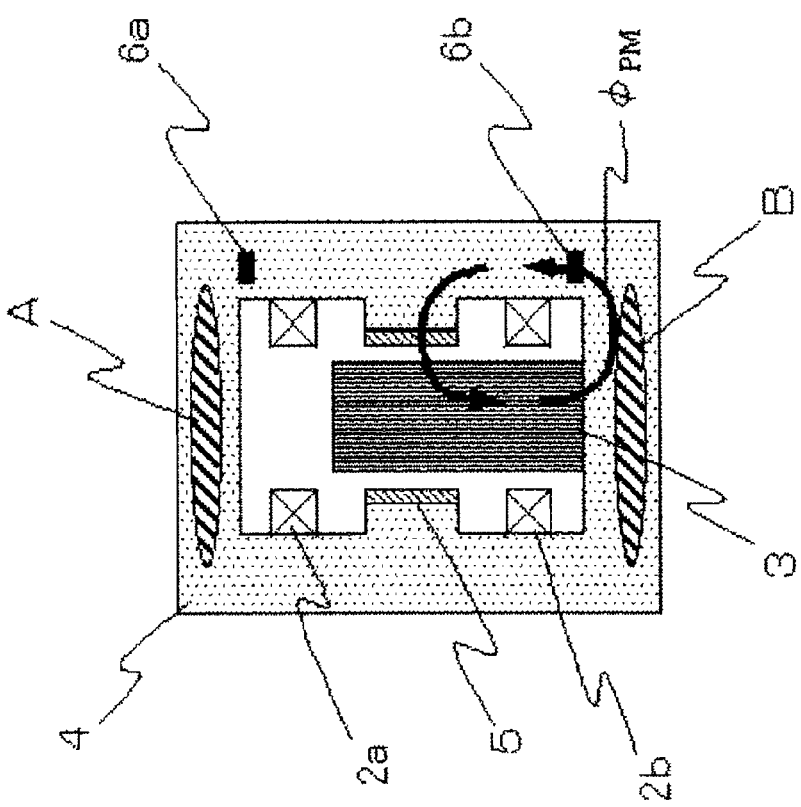
FIG. 7B

CONDITION-MONITORING DEVICE AND SWITCH-CONTROL DEVICE PROVIDED WITH THE SAME

FIELD OF THE INVENTION

The present invention relates to a condition-monitoring device that monitors, when a switchgear such as a power circuit breaker is operated by an electromagnetic actuator, condition of a device to be operated, the electromagnetic actuator, or the switchgear. The invention further relates to a switch-control device provided with the condition-monitoring device.

BACKGROUND OF THE INVENTION

As a measurement device that measures switching contact wear, which is one of condition parameters of a circuit breaker, there has been, for example, a device that measures, by detecting using optical sensors the positions of marks attached to the drive shaft connected to the drive coils of an electromagnetic actuator, and checks the amount of deviation of the marks from their original positions due to wear of the contacts (for example, refer to Patent Document 1).

Patent Document 1: GB Patent Application Publication No. 2350724A (lines 15-20 on page 5 and FIG. 4)

SUMMARY OF THE INVENTION

Since a conventional measurement device is configured as mentioned above to measure the amount of switching contact wear, an optical sensor is needed, which causes the device to be large in size. Moreover, since such mark must necessarily be captured by being optically trained thereon, adjustment is needed for eliminating misalignment and like. In addition to that, the adjustment needs to be made with high precision because the amount of contact wear is of the order of several millimeters. Furthermore, two optical sensors per actuator, accordingly six sensors in a three-phase circuit breaker are required, which has raised a problem in that the measurement device becomes expensive.

The present invention is made to solve the problems as described above, and an object of the invention is to obtain a high-accuracy condition-monitoring device that can be made compact at low cost. Moreover, an object thereof is to obtain a switch-control device provided with such condition-monitoring device.

A condition-monitoring device according to the invention is provided in an electromagnetic actuator including a stationary core, a moving core configured to be movable with respect to the stationary core, magnet coils energized by a drive power-supply to move the moving core, and a permanent magnet disposed around the moving core. The condition-monitoring device for monitoring conditions of the electromagnetic actuator comprises a current measurement means for measuring a current flowing through the magnet coils; magnetic-flux measurement means for measuring magnetic flux inside the stationary core; a calculation means for generating a calculated waveform by performing a calculation using a current waveform representing a time variation of an output signal from the current measurement means and a magnetic-flux waveform representing a time variation of an output signal from the magnetic-flux measurement means; and a condition determination means, by finding a distinctive point on the calculated waveform, for determining conditions of the electromagnetic actuator based on information on the distinctive point.

In addition, a switch-control device according to the invention comprises a condition-monitoring device as recited in any of claims 1 through 6, which determines degree of failure on the basis of condition of an electromagnetic actuator, obtained by the condition-monitoring device, to perform a display according to the degree of failure, and to control the switching operation of the electromagnetic actuator at the occurrence of a major failure.

According to the present invention, a drive characteristic of the moving core can be obtained by performing a calculation using a magnetic-flux waveform and a current waveform. Therefore, an effect is brought about that a condition-monitoring device of small size and of low cost can be obtained that is able to accurately monitor condition of an electromagnetic actuator, a device operated by the electromagnetic actuator, or a switchgear.

Moreover, according to the invention, since a failure is displayed according to the degree of failure using such a condition-monitoring device as the above, work of checking condition of the apparatuses can be omitted from regular maintenance, allowing costs of maintenance work to be reduced. Moreover, since the switching operation is controlled when a major failure occurs, a fault due to a malfunction of a device to be operated can be prevented from occurring.

BRIEF DESCRIPTION OF THE DRAWINGS

FIG. 3 illustrates schematic configuration views of the electromagnetic actuating mechanism and a condition-monitoring device according to Embodiment 1 of the invention;

FIG. 7 illustrates the operations of the condition-monitoring device according to Embodiment 1 of the invention;

REFERENCE NUMERALS

Figure 1:
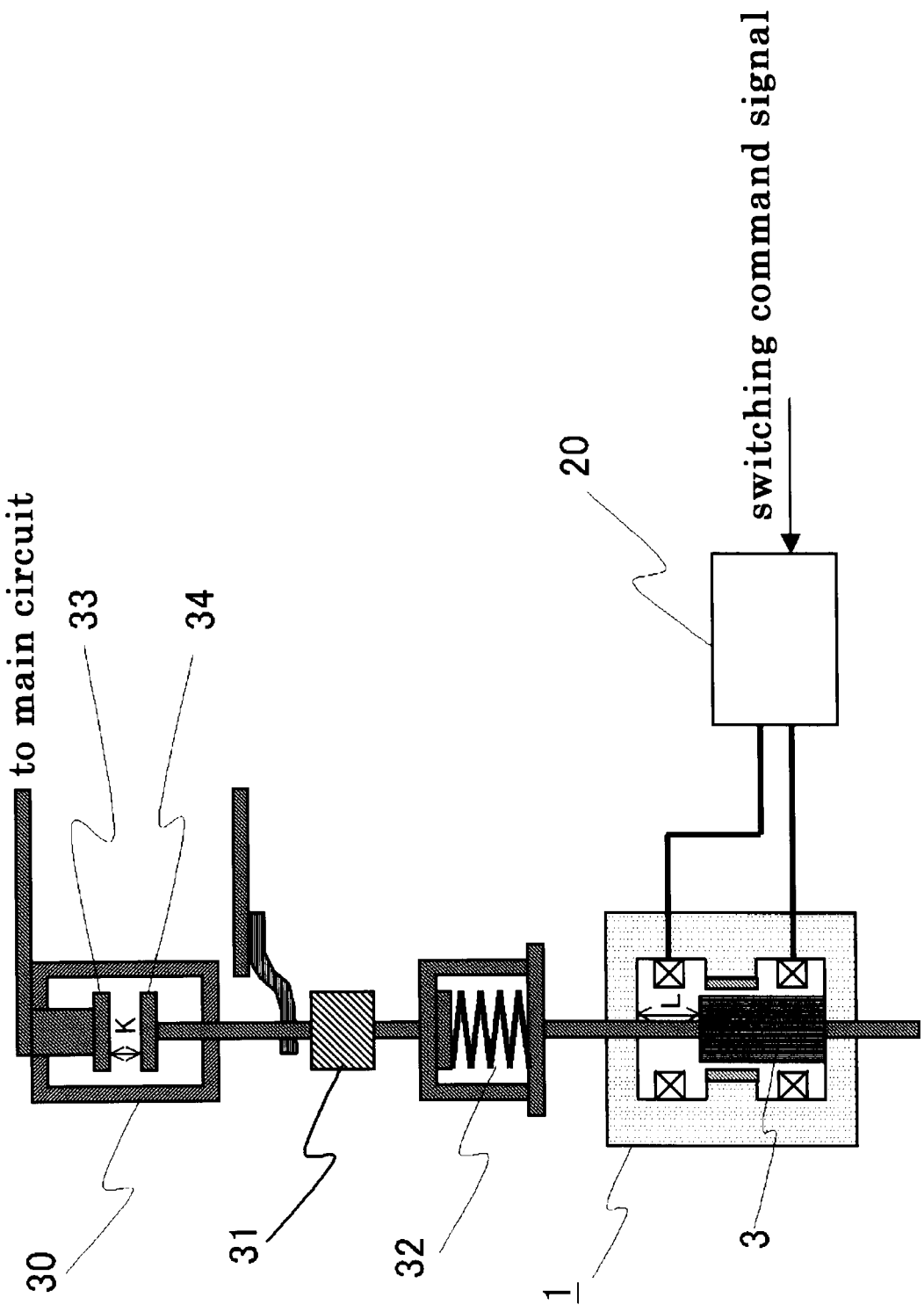
FIG. 1 is a schematic configuration view illustrating the "OPEN" state of a power switchgear with an electromagnetic actuating mechanism according to Embodiment 1 of the present invention.

1: electromagnetic actuating mechanism
2a: closing coil
2b: opening coil
3: armature
4: yoke
5: permanent magnet
6a, 6b: magnetic-flux sensor
7: current sensor
8: magnetic-flux-sensor insertion holes
9: moving shaft
10a, 10b, 11a, 11b: search coil
20: drive power-supply
21: waveform acquisition means
22: storage means
23: waveform calculation means
24: condition determination means
30: vacuum valve
31: insulation rod
32: wipe spring
33: stationary contact
34: moving contact
40: switch control device
41: condition-information display means
42: condition-information transmission means
43: switching-command transmission means
44: switching-command control means
45: switching-command input means
46: trip-signal input means

BEST MODES FOR CARRYING OUT THE INVENTION

Embodiment 1

Figure 2:
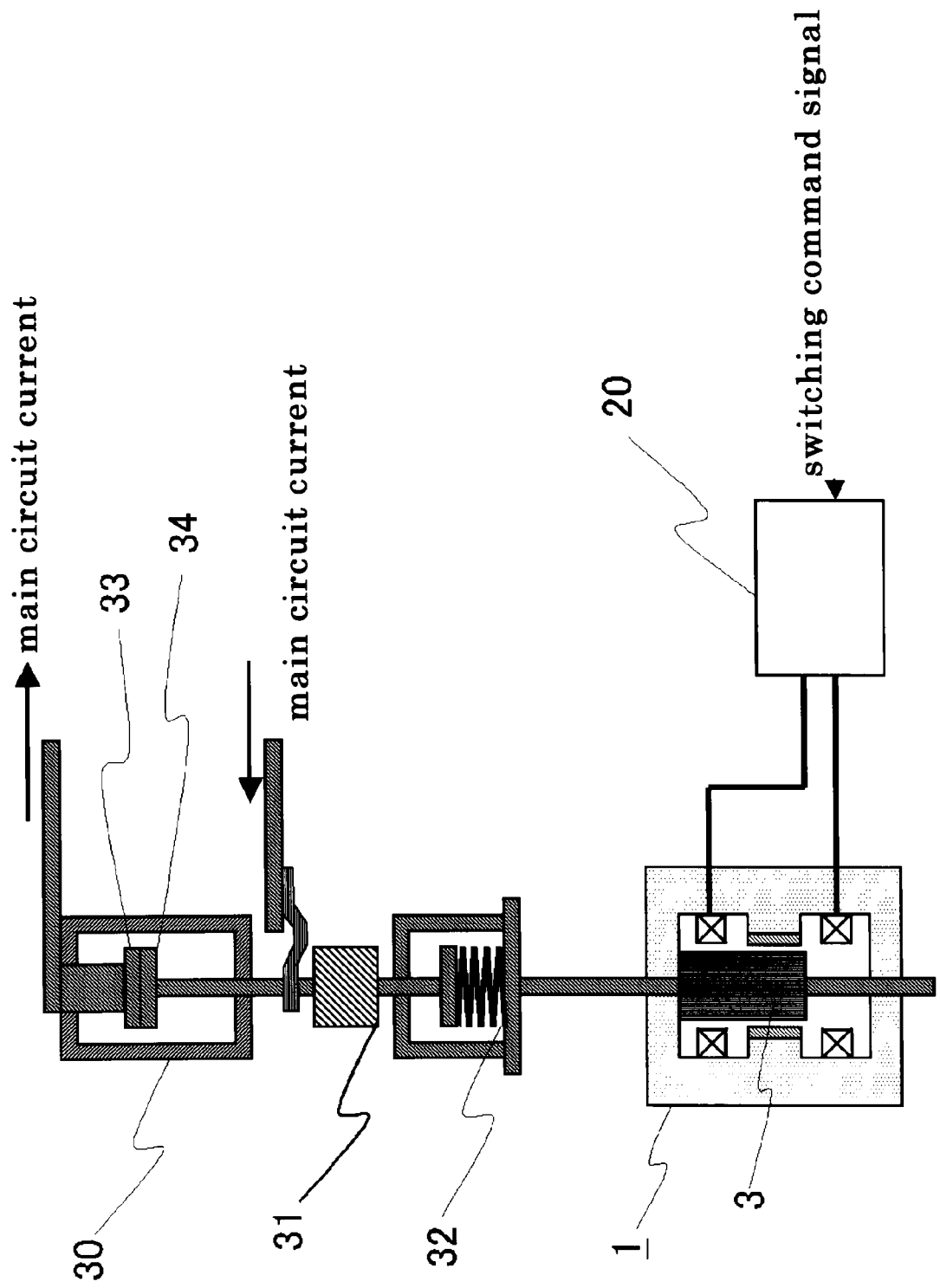
FIG. 2 is a schematic configuration view illustrating the "CLOSED" state of the power switchgear with the electromagnetic actuating mechanism according to Embodiment 1 of the invention.

FIGS. 1 and 2 are schematic configuration views of a power switchgear using an electromagnetic actuating mechanism (electromagnetic actuator) according to Embodiment 1 of the present invention, and the views are illustrated for one phase of an electric power system, which usually has three phases. FIGS. 1 and 2 illustrate the electric power system being in the "OPEN" and "CLOSED" states, respectively.

Switching of the electric power system are performed by movement of a moving contact (device to be operated) 34 inside a vacuum valve 30. The moving contact 34 is driven by an electromagnetic actuator 1. On a shaft connecting the moving rod 34 to the electromagnetic actuator 1, disposed are an insulation rod 31 to insulate the electromagnetic actuator 1 from the electric power system and a wipe spring 32 to bias contact pressure between the moving contact 34 and a stationary contact 33. The wipe spring 32 is assembled in a compressed state and mechanically clamped so as not to extend longer than a certain length. The electromagnetic actuator 1 operates by being energized from a power-supply circuit 20 in response to an external switching-command signal.

A drive distance L of an armature 3 that the moving contact 34 is connected to, of the electromagnetic actuator 1 is in most cases set to be longer than a drive distance K of the moving contact 34. For that reason, for example, in the case of actuation from the "OPEN" state to the "CLOSED" state, the armature 3 and the moving contact 34 are moved first toward the closing direction, with them being in the connected state. After the armature 3 and the moving contact 34 have traveled just the distance K, the moving contact 34 comes into contact with the stationary contact 33 to stop moving. Then, the armature 3 moves the distance of (L–K), so that the wipe spring 32 is compressed the length of (L–K). At that moment, the moving contact 34 is pressed against the stationary contact 33 by the spring force proportional to the compressed amount of (L–K) of the wipe spring.

In addition, in the case of actuation from the "CLOSED" state to the "OPEN" state, the armature 3 begins to move first, and then the wipe spring 32 extends along with the movement thereof. During this period, the moving contact 34 remains stopping in contact with the stationary contact 33. At the time when the armature 3 has moved just the distance of (L–K), the wipe spring 32 extends up to its maximum length. After that, the armature 3 and the moving contact 34 connectedly move. This time point is referred to as "wipe completion point".

FIG. 3 schematically illustrates configurations of the electromagnetic actuator and a condition-monitoring device according to Embodiment 1 of the invention: FIG. 3A is a view illustrating a configuration of the electromagnetic actuator and the condition-monitoring device; and FIG. 3B is a view illustrating part of a yoke (stationary core) of the electromagnetic actuator. FIG. 3B is a cross-sectional configuration view taken along Line B-B in FIG. 3A.

The electromagnetic actuator 1 is provided with the yoke 4, the armature 3 (moving core) configured to be movable with respect to the yoke 4, a closing coil 2a and an opening coil 2b both energized by a drive power-supply circuit 20, a permanent magnet 5 disposed around the armature 3, for holding the "OPEN" state or the "CLOSED" state, a moving shaft 9, and magnetic-flux sensors 6a and 6b inserted in the yoke 4. The armature 3 is firmly fixed to the moving shaft 9 and configured so as to move inside the yoke 4 in substantially linear fashion along the axis of the moving shaft 9. In FIG. 3, the armature 3 is in contact with the vacuum-valve-side (upper side) end plane of the yoke 4.

The power-supply circuit 20, in which an internal capacitor (not shown) is charged with electrical charge supplied from an external power supply, discharges for a given period the charged electrical charge to the coil 2a or 2b in response to an externally given "CLOSING" or "OPENING" command signal.

Although, in the method shown here, electrical charge is temporarily charged in a capacitor for coil discharge, a method can also be employed in which the coil 2a or 2b is energized directly by a current supplied from an external power supply.

The magnetic-flux sensors 6a and 6b are inserted in magnetic-flux sensor insertion holes 8 provided in the yoke 4, as shown in FIG. 3B. The magnetic-flux sensor 6a on the "CLOSED" side is disposed in a position where magnetic flux of the permanent magnet 5 permeates when the armature 3 is in the state of being held at the "CLOSED" position. The magnetic-flux sensor 6b on the "OPEN" side is disposed in a position where magnetic flux of the permanent magnet 5 permeates when the armature 3 is in the state of being held at the "OPEN" position.

The magnetic-flux sensors 6a and 6b, each being a Hall element or a Hall IC having a Hall element incorporated with calibration function, are supplied with electric power from a waveform acquisition means 21, and output a voltage or a current converted from magnetic flux measured at the respective sensor positions.

The waveform acquisition means 21 performs an A/D conversion of the output signals at a constant sampling interval during the period from the time point when the acquisition means receives the switching-command signal till the power-supply circuit 20 completes the discharge, to store the converted magnetic-flux waveform data into a memory 22.

In addition, the completion timing of the A/D conversion does not need to exactly coincide with that of the discharge from the power-supply circuit 20 but may beforehand be fixed in the waveform acquisition means 21.

While a current sensor 7 is a direct-current sensor using a Hall IC or a shunt resistor, a CT-type alternating-current sensor can also be employed depending on a discharge-current waveform condition. The current sensor 7 outputs a voltage signal or a current signal converted from the value of a current passed through the coil 2a or 2b from the power-supply circuit 20.

The waveform acquisition means 21 performs an A/D-conversion of the output signal at a constant sampling interval during the period from the time point when the acquisition means receives the switching-command signal till the power-supply circuit 20 completes the discharge, to store the converted current waveform data into the memory (storage means) 22.

A waveform calculation means 23 reads out from the memory 22 the magnetic-flux waveform data and the current waveform data both having been A/D-converted by the waveform acquisition means 21, to generate calculated waveform data by performing a calculation using the magnetic-flux waveform data and the current waveform data in accordance with procedures described later. The calculated waveform data is temporarily stored in the memory 22.

A condition determination means 24 calculates numerical data (condition values) that indicates operating condition of the actuator, such as the start timing of actuation, the completion timing of wipe, the completion timing of actuation, and driving velocity of the actuator, from the calculated waveform data, the current waveform data, and the magnetic-flux waveform data each having been stored in the memory 22. Moreover, the determination means determines whether or not these condition values are within respective predetermined normal condition-value ranges, to output a condition determination signal.

Furthermore, the determination means turns on status indicator lamps fitted on, for example, a panel of the switchgear or inside the panels thereof, based on the determination result. In addition, the condition-determination result may be transmitted to a monitoring system of power distribution facilities via a contact signal or a wire/wireless communication means.

Figure 4:
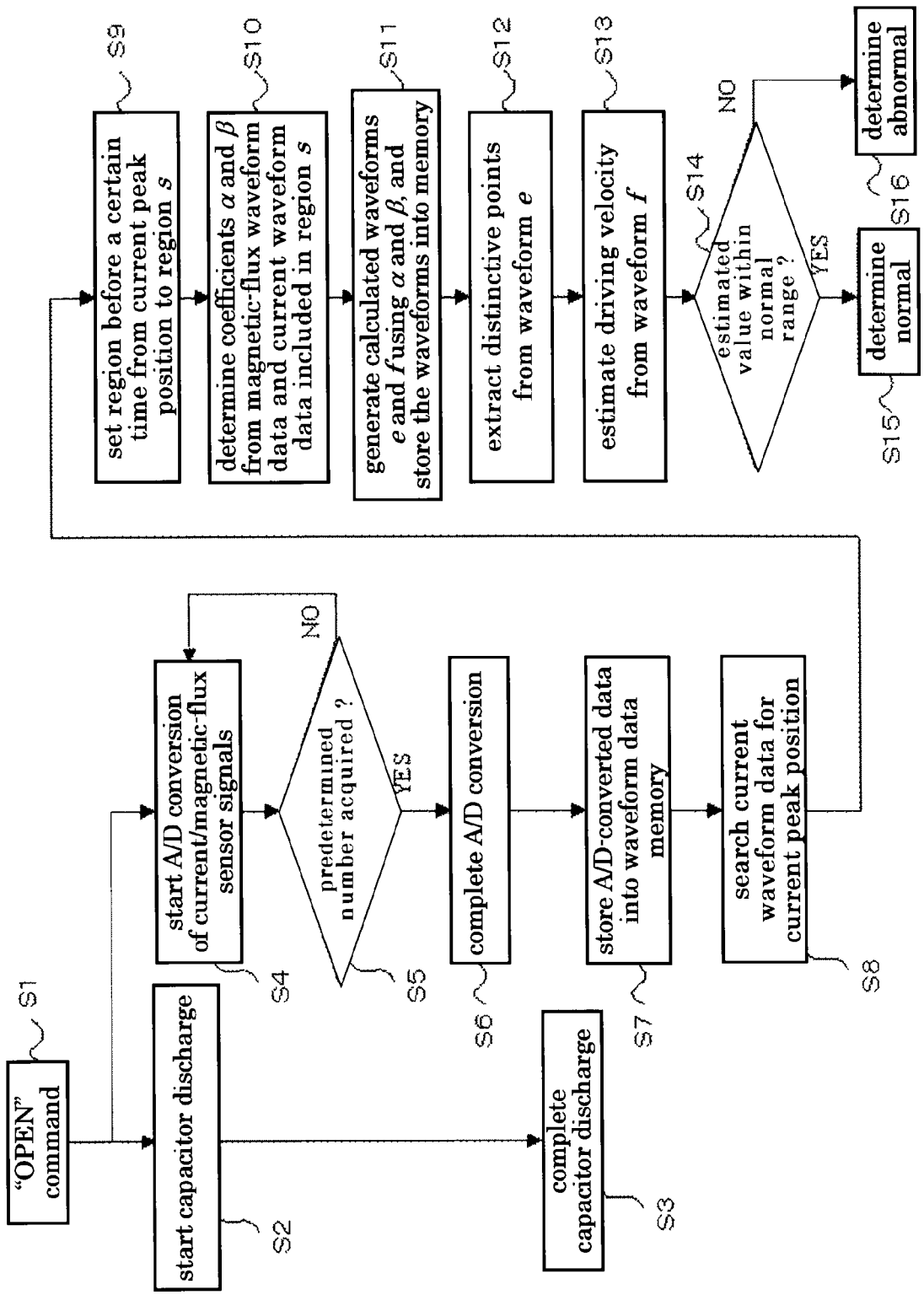
FIG. 4 is a flow chart for explaining operations of the condition-monitoring device and a switch-control device according to Embodiment 1 of the invention.

FIG. 4 is a flow chart for explaining operations of the condition-monitoring device and the switch-control device according to Embodiment 1 of the invention, in which opening operations from the "CLOSED" state to the "OPEN" state are indicated. When the "OPEN" command signal is input in Step S1, the power-supply circuit 20, in Steps S2 and S3, discharges to the opening coil 2b for a certain period the electrical charge having been charged in the capacitor. Meanwhile, in Steps S4 through S7, the waveform acquisition means 21 performs the A/D-conversion of output signals from the current sensor 7 and the magnetic-flux sensors 6a and 6b at a constant sampling interval, to store the converted time-varying waveform data into the memory 22. In Steps S8 through S10, the waveform calculation means 23 reads out magnetic-flux waveform data and current waveform data having been stored in the memory 22, to generate calculated waveforms by determining coefficients α and β, which are described later, from the magnetic-flux waveform data and the current waveform data in a region S before a certain time from a current peak position. The calculated waveform thus generated is stored into the memory 22 in Step S11. In Step S12, the condition determination means 24 extract distinctive points such as the starting point of operation and the completion point of wipe of the actuator from a calculated waveform e having been stored in the memory 22. In Step S13, driving velocity of the actuator is estimated from a calculated waveform f using the time and the value at the extracted distinctive point of the waveform. In Steps S14 through S16, determination is made whether or not the estimated driving-velocity value is within the predetermined normal range, and the result determined as normal or abnormal is output.

Next, a detailed description will be made on signals measured by the magnetic-flux sensors 6a and 6b, and on a method of calculation of the magnetic-flux waveform data and the current waveform data obtained from signals of the magnetic-flux sensors 6a and 6b and the current sensor 7.

Figure 5:
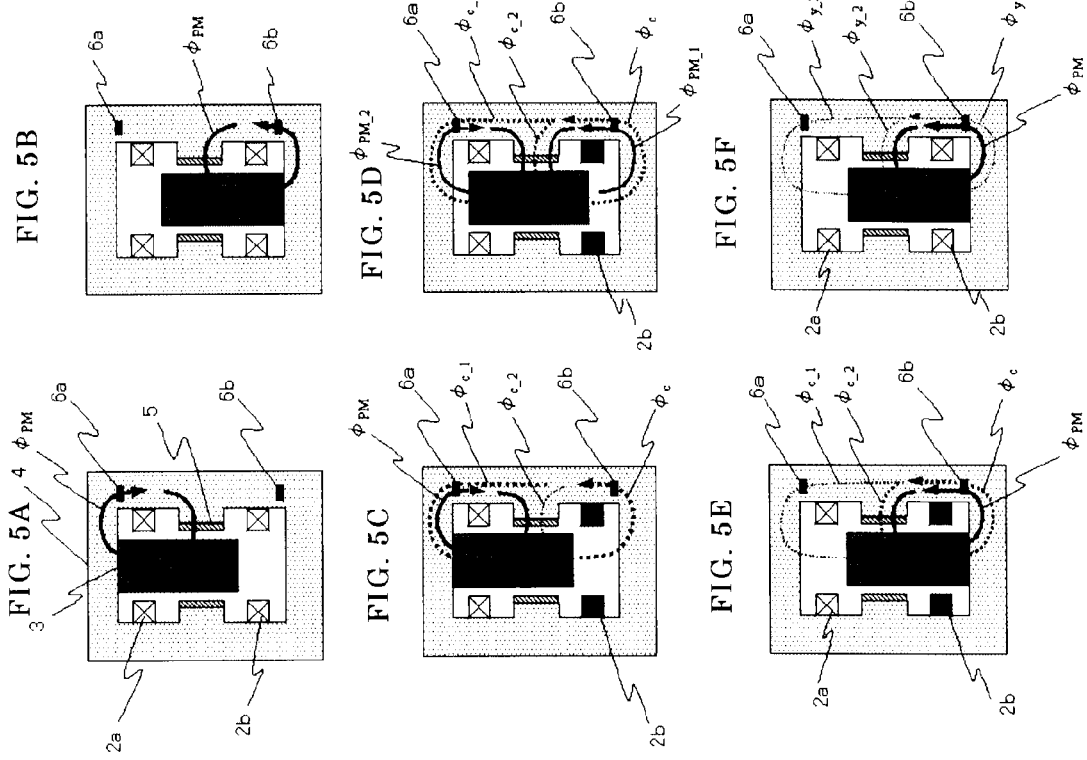
FIG. 5 illustrates magnetic-flux flow inside the electromagnetic actuator according to positions of the armature thereof, in Embodiment 1 of the invention.

FIGS. 5A through 5F are illustrations of major magnetic-flux flow patterns inside the electromagnetic actuator in response to positions of the armature 3. FIGS. 5A and 5B illustrate major magnetic-flux flow patterns produced by the permanent magnet in the "CLOSED" and "OPEN" states, respectively, and FIGS. 5C through 5F illustrate magnetic-flux flow patterns produced by the permanent magnet 5 and the opening coil 2b. Since the magnetic-flux lines are bilaterally symmetric, only right-halves thereof are illustrated in the figures.

As shown in FIG. 5A, the magnetic flux produced by the permanent magnet 5 exerts force (holding force) on the armature 3 to hold it in the contact state with the yoke 4. In that state, when the opening coil 2b is energized by a current flowing in such a direction that it cancels the magnetic flux produced by the permanent magnet 5, if the current is sufficiently large, the holding force by the permanent magnet 5 diminishes. The armature 3 is hence moved downward (in the direction to "OPEN") by the magnetic flux produced by the coil 2b, to come into contact with the under plane (the "OPEN" side end plane) of the yoke 4. With this state, a holding force is produced by magnetic flux of the permanent magnet 5 so as to keep the armature 3 to be in contact with the "OPEN" side end plane (FIG. 5B). In the state of the armature 3 being in contact with the "OPEN" side end plane, energizing the closing coil 2a allows the armature 3 to move toward the "CLOSED" side to be held in the "CLOSED" position (FIG. 5A) through the similar process.

In the state of the armature 3 being at rest on the "CLOSED" side and the coils 2a and 2b not being energized (FIG. 5A), the magnetic-flux sensor 6a is measuring magnetic flux $\phi_{PM}$ produced by the permanent magnet 5. Actually, the sensor is measuring, in addition to the flux $\phi_{PM}$, magnetic flux $\phi_y$ produced by magnetization of the yoke 4 at the same time. As for measurement of the flux $\phi_y$, it will be described later.

When the coil 2b is energized, magnetic flux $\phi_{c\_1}$ and $\phi_c$ produced by the coil 2b comes to be measured by the magnetic-flux sensors 6a and 6b, as illustrated by the dashed line in FIG. 5C.

The magnetic flux produced by the coil 2b flows along each of two paths: a path ($\phi_c$ to $\phi_{c\_1}$) from the contact plane between the "CLOSED" side end plane of the armature 3 (upper end plane in the figure) and the yoke 4, to the yoke 4 through the "OPEN" side end plane of the armature 3 (lower end plane in the figure); and the path ($\phi_c$ to $\phi_{c\_2}$) from the yoke 4 and back thereto through the permanent magnet 5 and part of the armature 3.

In the contact plane between the yoke 4 and the "CLOSED" side end plane of the armature 3, the magnetic flux $\phi_{PM}$ and $\phi_{c\_1}$ produced by the permanent magnet 5 and the coil 2b, respectively, flow in directions opposite from each other.

There is the following relation between $\phi_c$, $\phi_{c\_1}$, and $\phi_{c\_2}$:

$$\phi_c = \phi_{c\_1} + \phi_{c\_2}.$$

In addition, since there is an air gap between the permanent magnet 5 and the armature 3 in the path from $\phi_c$ to $\phi_{c\_2}$, and the permanent magnet 5 itself serves as an air gap, there is the following relation:

$$\phi_{c\_1} > \phi_{c\_2}.$$

Components of the magnetic flux produced by the coil 2b, measured by the magnetic-flux sensors 6a and 6b are $\phi_{c\_1}$ and $\phi_c$, respectively.

Even when the coil 2b is energized, during the state before the armature 3 begins to move, the magnetic flux $\phi_c$ and $\phi_{c\_1}$ are proportional to a current I energizing the coil 2b.

As shown in FIG. 5D, when the armature 3 begins to move by increasing the current energizing the coil 2b, the magnetic flux $\phi_{PM\_2}$ by the permanent magnet 5, which is measured by the magnetic-flux sensor 6a, begins to decrease with increasing the gap between the "CLOSED" side end plane of the armature 3 and the yoke 4. In other words, the magnitude of the magnetic flux $\phi_{PM\_2}$ by the permanent magnet 5 depends on positions of the armature 3 and hence has a monotonically decreasing characteristic.

In contrast, with regard to the magnetic flux produced by the coil 2b, there are always gaps between the "OPEN" side end plane of the armature 3 and the yoke 5, and between the "CLOSED" side end plane thereof and the yoke 5. Since movement of the armature 3 makes no change in the summation of the "OPEN" side gap and the "CLOSED" side gap, variation of $\phi_{c\_1}$ passing through the sensor 6a is small regardless of the positions of the armature 3, and hence the magnitude of $\phi_{c\_1}$ is proportional to the current flowing through the coil 2b.

Meanwhile, magnetic flux measured by the magnetic-flux sensor 6b on the "OPEN" side is the summation of the magnetic flux $\phi_{PM\_1}$ and $\phi_c$ produced by the permanent magnet 5 and the coil 2b, respectively. Since the gap between the "OPEN" side end plane of the armature 3 and the yoke 5 narrows as the armature 3 moves, the magnetic flux $\phi_{PM\_1}$ has a monotonically increasing characteristic.

Variation of $\phi_c$ has a tendency that it is superimposed with an effect of increasing $\phi_c$ due to decrease in gap between the "CLOSED" side end plane of the armature 3 and the yoke 4 as the armature 3 moves and an effect of varying $\phi_c$ in proportion to the current energizing the coil 2b. However, since there is always the permanent magnet 5 as an air gap in the magnetic-flux flow path from $\phi_c$ to $\phi_{c\_2}$, the degree of variation of $\phi_c$ due to the position variation of the armature 3 is smaller compared with that of $\phi_{PM\_1}$.

Although the above explanation is based on the assumption that the yoke 5 is not magnetically saturated, when magnetic saturation occurs, the above relation may not be satisfied in some cases. It may be conceivable from ordinary magnetic circuit design that when the armature 3 is in contact with yoke 4 on the "OPEN" side or the "CLOSED" side, magnetic saturation may occur; when the armature 3 is in motion, magnetic saturation does not occur. To be specific, even though magnetic saturation occurs in part in the state shown in FIG. 5A, no magnetic saturation occurs in the states shown in FIGS. 5C and 5D.

In addition, FIG. 5E shows the state just after the armature 3 has finished moving. At this time, the coil 2b has been still energized, so that magnetic saturation may sometimes occur because magnetic flux $\phi_c$ and $\phi_{PM}$ produced by the coil 2b and the permanent magnet 5, respectively, are in the same direction.

After a certain time elapses from the completion of movement of the armature 3 (FIG. 5E) (actually, after a certain time elapses from the start of energizing the coil 2b), energization of the coil 2b has been completed, so that the electromagnetic actuator comes into the state shown in FIG. 5F. In the state shown in FIG. 5F, remanent magnetization exist in the yoke 4 and the armature 3 because of influence of the coil 2b exciting them during the period from the state shown in FIG. 5C to that shown in FIG. 5E, so that magnetic flux $\phi_y$, $\phi_{y\_1}$, and $\phi_{y\_2}$ are produced by the remanent magnetization. For that reason, the magnetic flux $\phi_{y\_1}$ is measured by the magnetic-flux sensor 6a and value of the magnetic flux $\phi_y$ plus the magnetic flux $\phi_{PM}$ produced by the permanent magnet 5 is measured by the magnetic-flux sensor 6b.

In this way, the magnetic-flux sensors 6a and 6b measure a magnetic-flux variation that is superimposed with components due to position variation of the armature 3 and to variation of the coil current I. For example, a value of $\phi_{6a}$ measured by the magnetic-flux sensor 6a can be expressed as the summation of a permanent-magnet magnetic flux $\phi_{PM\_6a}(x)$ depending on positions x of the armature 3 and magnetic flux $\phi_{c\_6a}(x, I)$ depending on both the positions x of the armature 3 and the current I of the coil 2b:

$$\phi_{6a}(t) = \phi_{PM\_6a}(x(t)) + \phi_{c\_6a}(x(t), I(t)) \qquad (1),$$

where, since the positions x of the armature 3 and the coil current I each depend on time t, they are expressed as x(t) and I(t), respectively.

The flux $\phi_{c\_6a}(x, I)$, since it may be considered proportional to the current value I, can be rewrite below:

$$\phi_{c\_6a}(x, I) = \Phi_{c\_6a}(x) * k_1 * I \qquad (2),$$

where $k_1$ is a proportionality coefficient, and $\phi_{c\_6a}(x)$ is a function representing a relation of $\phi_{c\_6a}$ to x.

Both $\phi_{PM\_6a}$ and $\Phi_{c\_6a}$, since they are functions representing relations between the gap between the armature 3 and the yoke 4, and the magnetic flux passing the gap, can be assumed to be approximately expressed by the same function:

$$\Phi_{c\_6a}(x) = k_2 * \phi_{PM\_6a}(X) \qquad (3),$$

where $k_2$ is a proportionality coefficient.

From the above, the following formula is derived:

Formula 1

$$\phi_{6a}(t) = \phi_{PM\_6a}(x) + k_2 \cdot \phi_{PM\_6a}(x) \cdot k_1 \cdot I \quad (4)$$
$$\phi_{6a}(t) = \phi_{PM\_6a}(x) \cdot (1 + k_1 \cdot k_2 \cdot I)$$
$$\phi_{PM\_6a}(x) = \frac{\phi_{6a}(t)}{(1 + k_1 \cdot k_2 \cdot I(t))}$$

Accordingly, if a mathematical relation between x and $\phi_{PM\_6a}$ is known, a relation between positions x of the armature 3 and time t can be obtained by the following formula:

Formula 2

$$x(t) = \phi^{-1}\left(\frac{\phi_{6a}(t)}{(1 + k_1 \cdot k_2 \cdot I(t))}\right) \quad (5)$$

In addition, when variation of $\Phi_{c\_6a}$ to x is sufficiently smaller compared with that of $\phi_{PM\_6a}$ to x as described above, $\Phi_{c\_6a}$ can approximate nearly constant with respect to x, to be expressed below:

$$\phi_{6a}(t) = \phi_{PM\_6a}(x) + k_3 * I \quad (6),$$

where $k_3$ is a proportionality coefficient.

Consequently, the formula (5) is expressed below:

$$x(t) = \phi_{PM\_6a}^{-1}(\phi_{6a}(t) - k_3 * I(t)) \quad (7).$$

For example, if $\phi_{PM\_6a}(x)$ is a linear function, x(t) can be expressed below:

$$x(t) = k_4 * (\phi_{6a}(t) - k_3 * I(t)) + k_5 \quad (8),$$

where $k_4$ and $k_5$ are constants.

In this way, magnetic-flux waveforms representing time variations of output signals from the magnetic-flux sensors 6a and 6b, and also a waveform representing a time variation of a current energizing the coil 2b (a waveform representing a time variation of an output signal from the current sensor 7) are acquired during the armature 3 is moved from the "CLOSED" position to the "OPEN" position. After that, by performing an appropriate calculation process using the magnetic-flux waveforms and the current waveform, the current-variation component can be eliminated from the magnetic-flux waveforms. The waveform thus obtained expresses a time variation of position of the armature 3.

Figure 6:
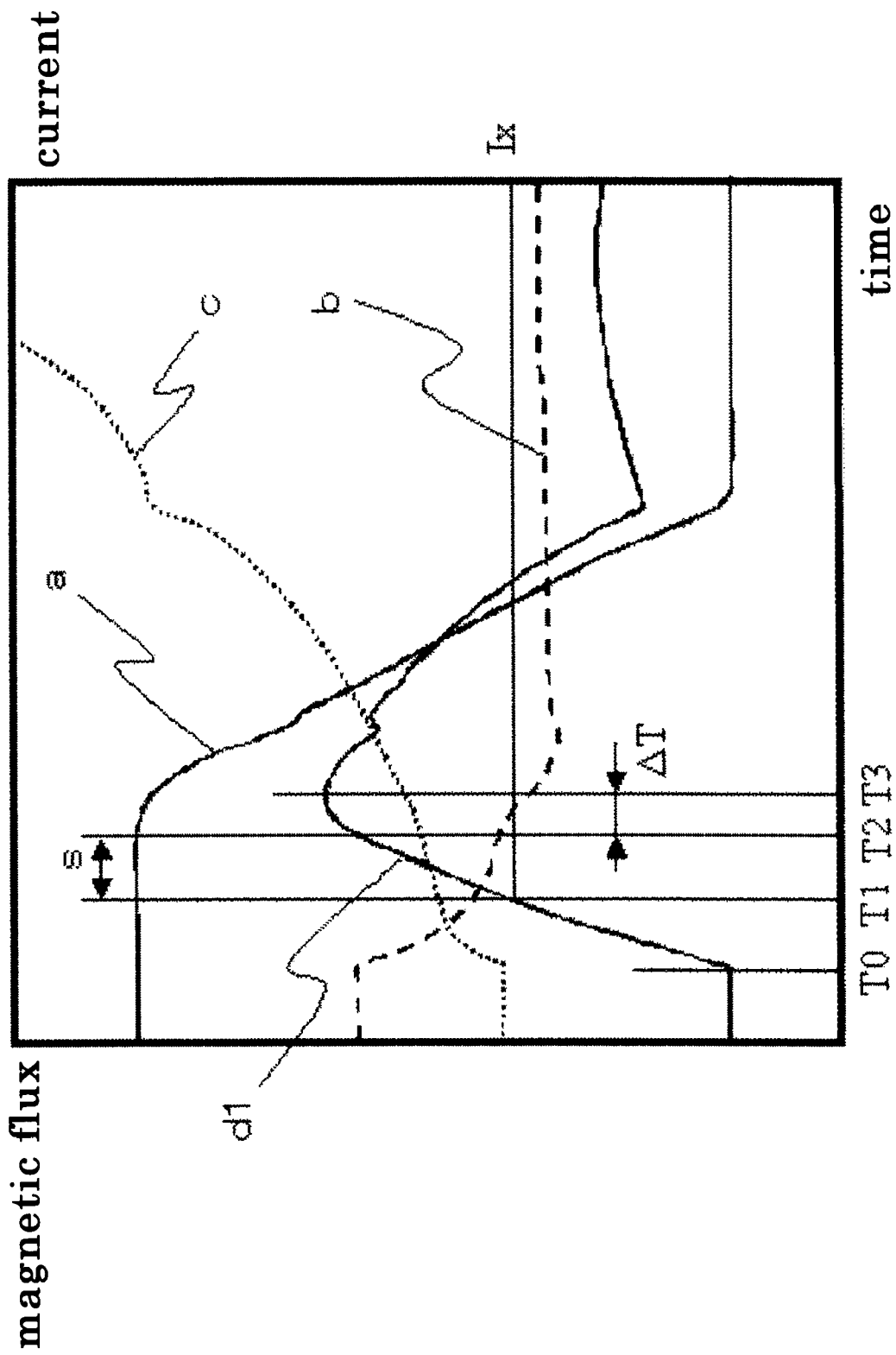
FIG. 6 illustrates characteristic graphs of positions of the armature, a current through the opening coil, and outputs of the magnetic-flux sensors, when the armature travels from the "CLOSED" state to the "OPEN" state, in Embodiment 1 of the invention.

FIG. 6 shows graphs of positions of the armature 3 (a waveform a), outputs of the magnetic-flux sensors 6a (a waveform b) and 6b (a waveform c), and an energizing current of the opening coil 2b (a waveform d1), during the armature 3 is moved from the "CLOSED" position to the "OPEN" position. In FIG. 6, the horizontal axis denotes time, the left vertical axis is a scale for the output signal from the current sensor 7, and the right one is that for the output signals of the magnetic-flux sensors. In addition, a vertical axis for the waveform a is a scale for positions of the armature 3.

The waveform b, while it monotonically varies during from the start of the armature 3 (a time T2) to around one-third of its entire stroke, is nearly flat after the latter one-third region. This is because magnetic flux produced by the permanent magnet 5 almost flows not in the "CLOSED" side but in the "OPEN" side, as the armature 3 moves.

Meanwhile, the waveform c varies monotonically over the entire stoke. This is because portions A and B, indicated in FIG. 7A, in the actuator are formed asymmetric. Namely, although the armature 3 moves from the "OPEN" side to the "CLOSED" side (from the state shown in FIG. 7A to that shown in FIG. 7B), magnetic flux $\phi_{PM\_1}$ continues to flow in the portion B because of large magnetic resistance in a magnetic-flux path of the portion A.

Figure 8:
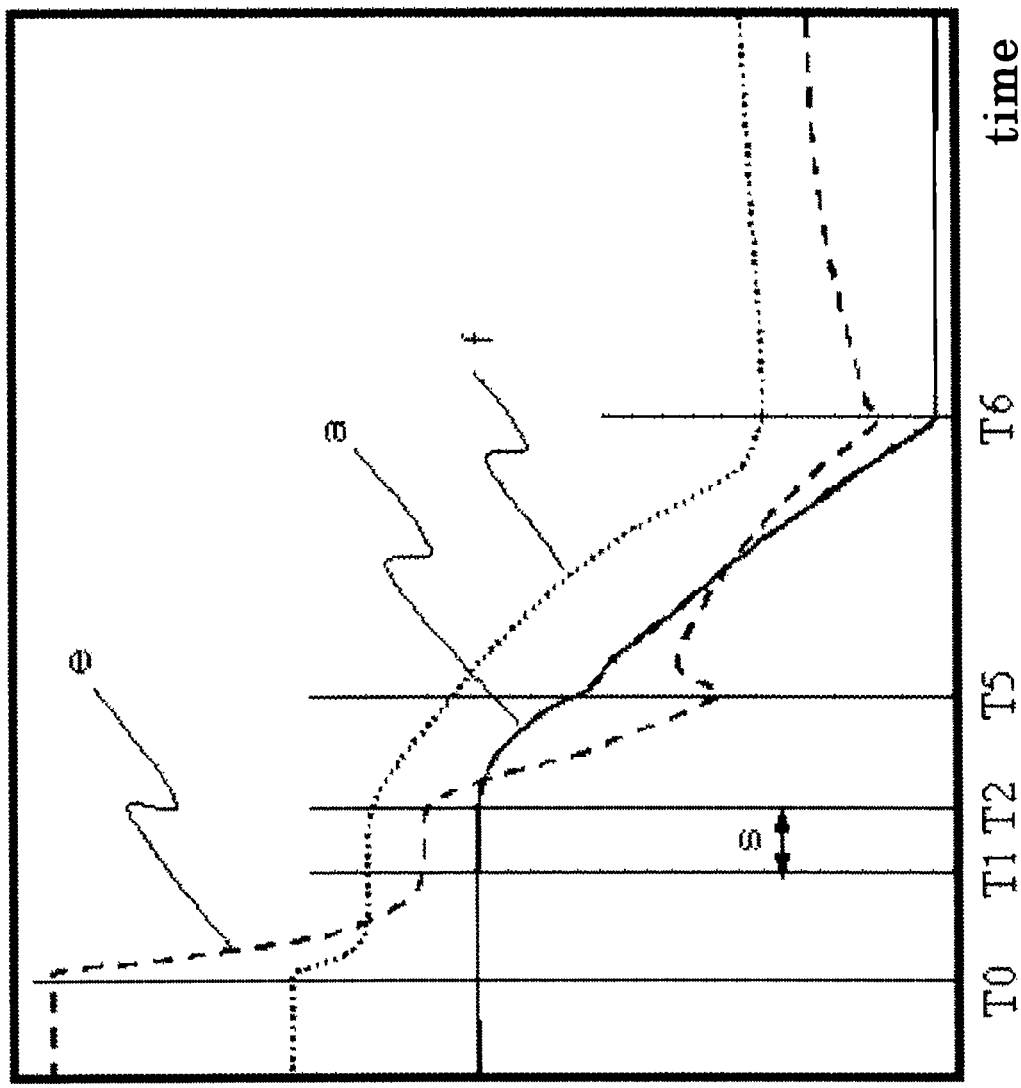
FIG. 8 illustrates characteristic graphs of positions of the armature and calculated waveforms e and f when the armature travels from the "CLOSED" state to the "OPEN" state, in Embodiment 1 of the invention.

FIG. 8 illustrates, as an example of the calculation in Step S11, the result of subtracting a value having been obtained by multiplying a current waveform by a constant from a magnetic-flux waveform. A waveform e denotes the difference between the magnetic waveform b and the product of the current waveform d1 and a coefficient α, and a waveform f denotes the difference between the magnetic waveform c and the product of the current waveform d1 and a coefficient β.

The coefficients α and β here are determined under the condition that a flat region s appears on each waveform e and f before the armature 3 starts to move. The condition is determined from the reason that the waveforms e and f which are the calculation result, are supposed to have no time variations before the armature 3 starts to move, because the waveforms must necessarily have relations between positions x of the armature 3 and time t as shown in the formulas (1) and (2). Satisfying the condition that the waveforms e and f have the flat regions is, specifically, to determine α and β in such a way that the time variations of the waveforms each have a local minimum within the region s.

As for a method of determining the region s, it is conceivable to predetermine the region as that specific to an actuator, to define the region as a time region before a certain time from a peak position of the current, or to estimate the region from magnetic-flux waveforms obtained from the magnetic-flux sensors.

In FIG. 8, comparing the calculated waveform e with the waveform a representing positions of the armature 3, a correlation with the waveform a is obtained in a region around one-third of the stroke from the start of the armature 3 to move. In particular, the starting point (T2) of the armature 3 and the completion point of the wipe (T5) are replicated. As for the calculated waveform f, while it has a lower sensitivity at the starting point (T2) of the armature 3 compared to the calculated waveform e, a correlation with the waveform a representing positions of the armature 3 is obtained over the entire stroke thereof.

A method of determining the coefficients α and β will be specifically described here. Here, in the method of driving the coils using electrical charge charged in a capacitor, the description is made based on a method of determining the flat region s from a peak position of the current driving the coil.

As the first procedure, the flat region s is determined (Steps S8 though S9 in FIG. 4).

In FIG. 8, the calculated waveforms e and f vary rapidly immediately after the discharge starts (time point T0), and the flat region s appears afterward. In the rest state, the yoke 5 of the actuator is magnetically saturated with the magnetic flux produced by the permanent magnet 5. Upon starting the discharge, magnetic flux is produced by the coil in such a direction as to cancel the magnetic flux produced by the permanent magnet 5. The coil current I and a magnetic-flux-sensor measurement value B satisfy a relation of I ∝ B during the period from the time point when the yoke 5 is released from the magnetic saturation state as the discharge current increases, to the time point when the armature 3 starts to move. The above-mentioned flat region s is conceivable to indicate a period that is from the time point of the release from the magnetic saturation to the starting time point of the armature 3 to move. Since a time point of release from magnetic saturation is substantially depends on a configuration of the actuator 1 and a current value of the coil, the time point is almost the same in a switchgear with the same configuration. Accordingly, if a time point of release from magnetic saturation is measured beforehand and stored as a time point T1 into the memory 22, the time point of beginning of a flat region s can be determined. In addition, since the time point of release from saturation is depends on a coil current value as mentioned above, the time point T1 of beginning of the flat region s may be determined to be a time point when the coil current I comes equal to a predetermined constant value Ix, as shown in FIG. 6

Next, in order to determine the end time point T2 of the flat region s (starting time point of the armature 3), a current-peak time point T3 is detected. A coil-driving current generally has such a waveform as the waveform d1 shown in FIG. 6. While a coil current increases from the capacitor-discharge time point T0 with a time constant determined from capacitance C of the capacitor and inductance L of the coil, upon starting the armature 3 of the actuator, the coil current is restricted by rapid increase of the inductance L. The current waveform d1 thereby has a peak as seen in FIG. 6. While the start timing of the armature 3 is before the current-peak time point, an actuator with the same configuration has an approximately constant time interval between the current-peak time point and the starting time point of the armature 3 to move. Accordingly, if such time interval is measured beforehand, to be stored as a time interval ΔT into the memory 22, the starting time point T2 of the armature 3 to move can be estimated from the current-peak time point T3 as (T3−ΔT).

As for a method of estimating a current-peak time point, by making a quadratic-function approximation for waveform data around a time point where a current value reaches its maximum, the current-peak time point is set to a time point where the approximation function has a maximum value. However, if a noise component in the output of the current sensor is sufficiently small, the peak time point may be set to a time point where the current value itself reaches its maximum.

In addition, the peak time point may be set to a time point where a current waveform data has a maximum value after the data has been subject to a smoothing process.

In addition, depending on a configuration of the actuator or capacitance of the capacitor, a second current peak may sometimes appear after the time point of a first current peak and may be higher than the first one. In such case, the current-peak time point is set to a time point of the first current peak.

As the second procedure, in the flat region s, that is, the time region from T1 to T2 (=T3−ΔT), values $\sigma_b$ and $\sigma_c$ expressed by the following formulas (9) and (10), and formulas (11) and (12), respectively, are estimated by successively varying α and β, to find α and β that minimize the value $\sigma_b$ or $\sigma_c$ ((Step S10 in FIG. 4).

Formula 3

$$\sigma b = \sum_{(s)} \{(b_k - \alpha \cdot I_k) - \overline{Sb}\}^2 \qquad (9)$$

$$\overline{Sb} = \frac{\sum_{(s)} (b_k - \alpha \cdot I_k)}{M} \qquad (10)$$

-continued $$\overline{Sc} = \frac{\sum_{(s)} (-c_k - \beta \cdot I_k)}{M} \qquad (11)$$

$$\sigma c = \sum_{(s)} \{(-c_k - \beta \cdot I_k) - \overline{Sc}\}^2 \qquad (12)$$

Here, $b_k$, $c_k$, and $I_k$ are waveform data stored in the memory 22 that have been measured by the magnetic-flux sensors 6a and 6b and by the current sensor, respectively, followed by the A/D conversion at a constant sampling rate. The sampling rate is assumed to be common to each sensor, and the number of each data is assumed to be N.

$$\sum_{(s)} \qquad \text{Formula 4}$$

The above operator represents the summation of data in the region s among the sampled data. In addition, a numeral M denotes the number of data in the region s among the waveform data sampled from each sensor.

It is noted that the negative sign attached to the magnetic-flux data $c_k$ in the formulas (11) and (12) is for compensating the direction difference between the magnetic sensors 6a and 6b. If one of the magnetic-flux sensors is turned over 180 degrees in its direction, no negative sign needs to be attached.

Furthermore, using the coefficients α and β thus obtained, the calculated waveforms e and f are calculated as follows (Step S11 in FIG. 4):

$$e_i = b_i - \alpha * I_i \qquad (13)$$

$$f_i = -c_i - \beta * I_i \qquad (14),$$

where $b_i$ and $c_i$ denote the i-th sampled data of the waveform data, and $1 \leq i \leq N$.

Figure 9:
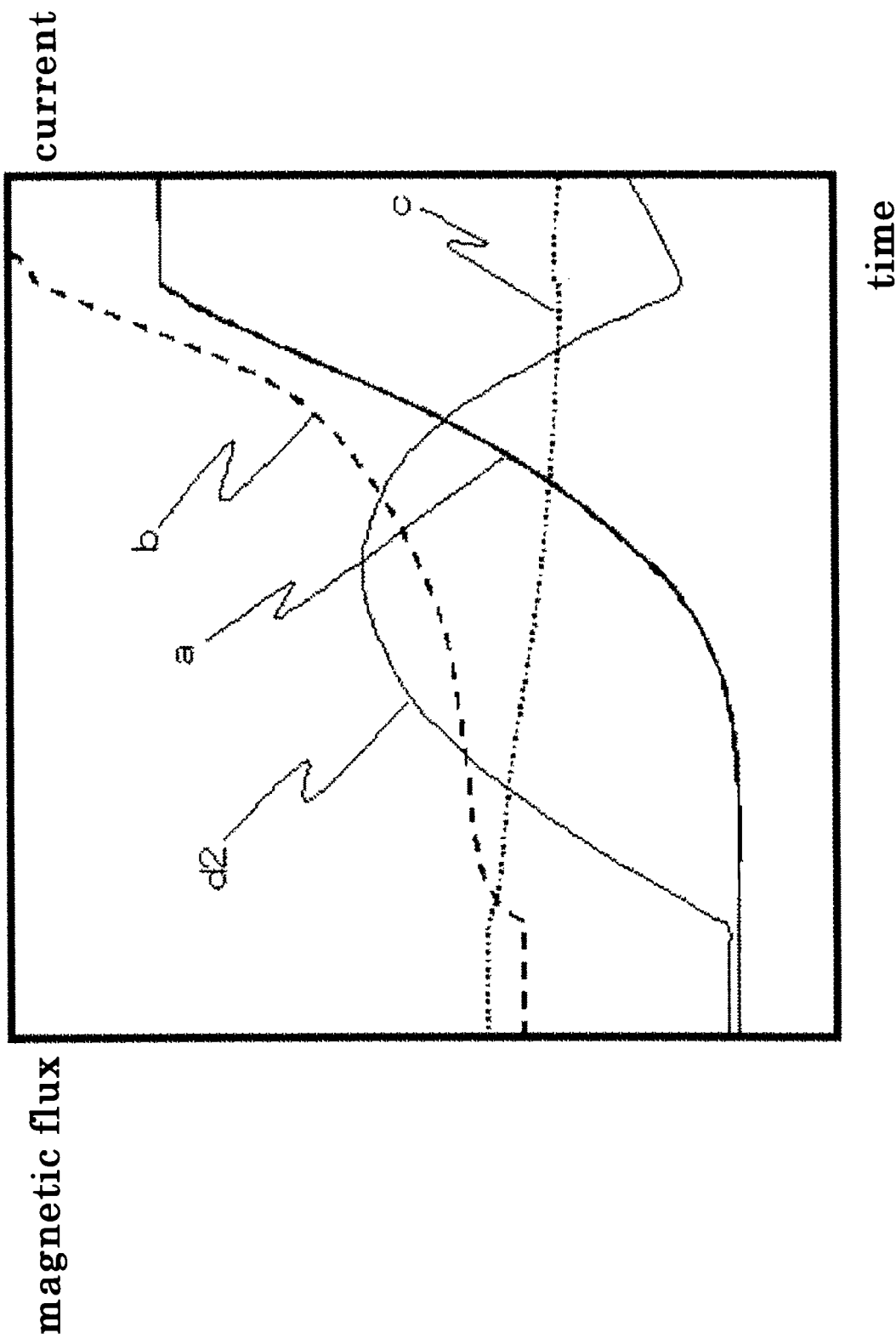
FIG. 9 illustrates characteristic graphs of positions of the armature, a current through the closing coil, and outputs of the magnetic-flux sensors, when the armature travels from the "OPEN" state to the "CLOSED" state, in Embodiment 1 of the invention.

FIG. 9 shows graphs of positions of the armature 3 (waveform a), outputs of the magnetic-flux sensors 6a and 6b (waveforms b and c), and a current energizing the closing coil 2a (waveform d2), when the armature 3 is moved from the "OPEN" position to the "CLOSED" position. In FIG. 9, the horizontal axis denotes time, the left vertical axis is a scale for the output signal from the current sensor 7, and the right one is that for the output signals from the magnetic-flux sensors. In addition, a vertical axis for the waveform a is a scale for positions of the armature 3.

Regarding also these waveforms, as mentioned above, calculation coefficients γ and δ for the current waveform are determined under the condition that the waveforms has a flat region before the time point when the armature 3 begins to move, for calculated waveforms g and h to be calculated as follows:

$$g_i = b_i - \gamma * I_i \qquad (15)$$

$$h_i = -c_i - \delta * I_i \qquad (16).$$

Figure 10:
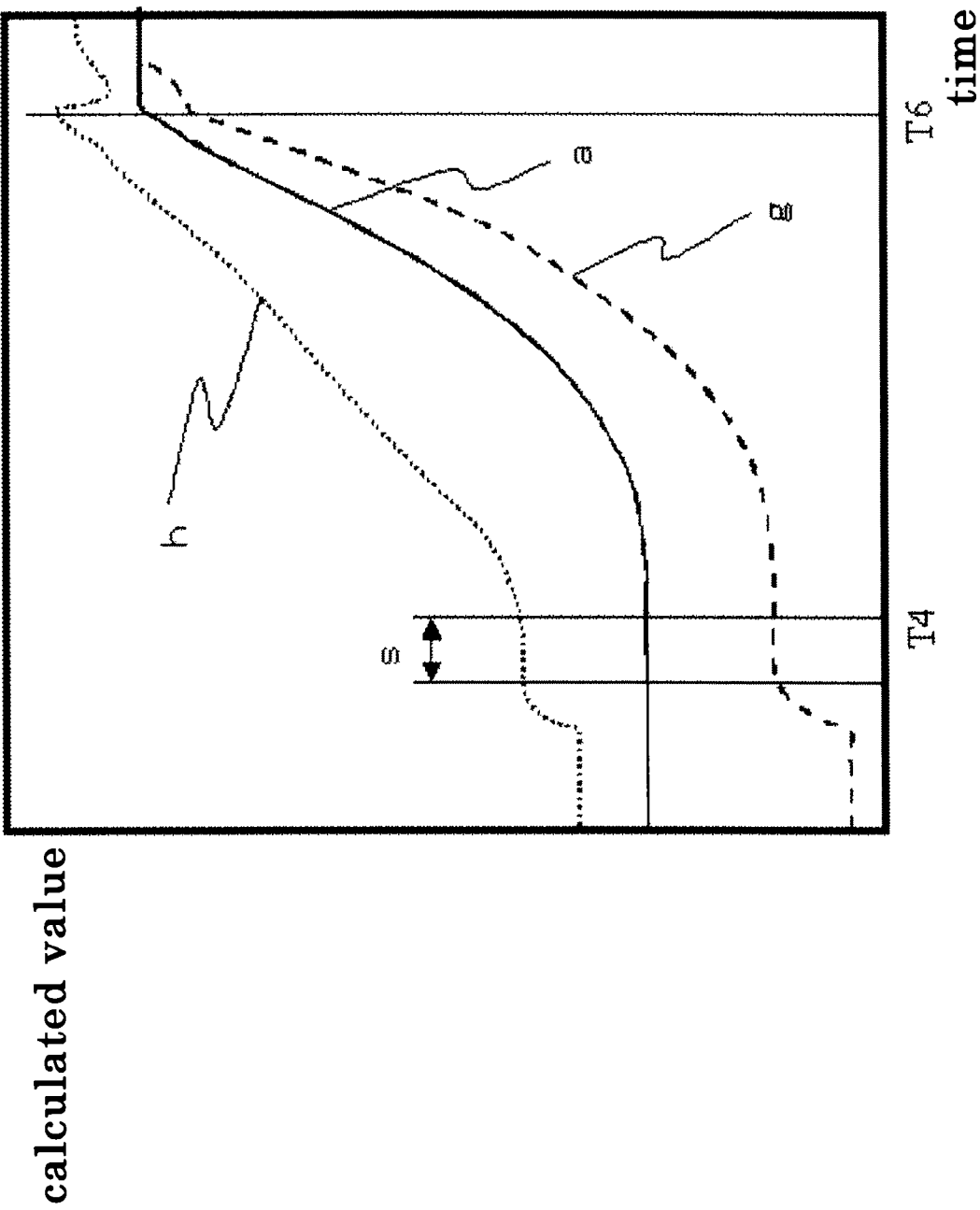
FIG. 10 illustrates characteristic graphs of positions of the armature and calculated waveforms g and h, when the armature travels from the "OPEN" state to the "CLOSED" state, in Embodiment 1 of the invention.

FIG. 10 shows the calculated waveforms g and h obtained by performing the calculation using the magnetic-flux waveforms and the current waveform. The calculated waveforms g and h have high correlations with positions of the armature 3 during from the starting time point of movement of the armature 3 to the completion time point of the movement.

Next, a detailed explanation will be made on procedures of calculating velocity of driving the armature 3 from the waveform data, which velocity is a parameter indicating a condition of the switchgear, and procedures of determining the condition thereof.

Figure 11:
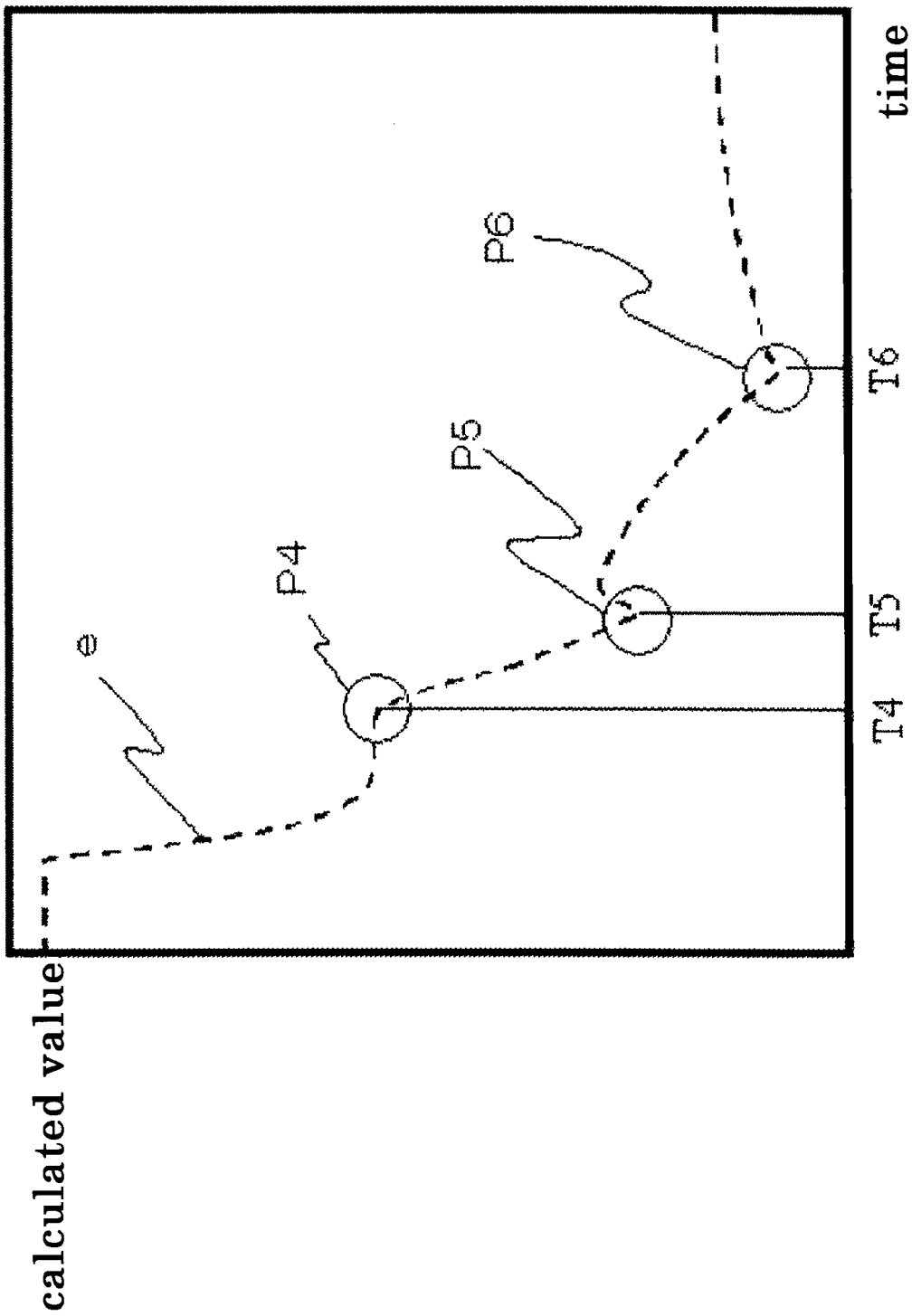
FIG. 11 is a graph for explaining distinctive points on the calculated waveform f, in Embodiment 1 of the invention.

The opening operation (Steps S12 through S16 in FIG. 4) is described first. In the first procedure, referring to the calculated waveform e, time points T4, T5, and T6 are determined by searching from the waveform data three distinctive points P4, P5, and P6 shown in FIG. 11. The distinctive point P4 is a point where values of the waveform begin to steeply decrease after the flat region s and which indicates the starting time point T4 (time point coincident with T2) of movement of the armature 3. The distinctive point P5 is a point where the waveform decreasing monotonically after T4 turns to increase temporarily and which is coincident with the completion point T5 of the wipe spring. The distinctive point P6 is a point where the waveform turning to decrease after T5 turns to increase again and which is coincident with the completion point T6 of movement of the armature 3.

In addition, depending on a configuration of the switchgear, the distinctive points P5 and P6 may not appear as points where a waveform turns from decrease to increase but may appear as bending points, in other words, points where the waveform abruptly changes in its tangent. As a method of searching such a distinctive point, there is a method in which a local maximum or a local minimum is set to the distinctive point similarly to the method of finding a current-peak point, a method in which a point where an absolute value of the second derivative of a waveform exceeds a predetermined threshold value is set to the distinctive point, and the like.

In the second procedure, by referring to the waveform f, values $f_t=T4$ and $f_t=T6$ thereof, which correspond to the values at the time points T4 and T6, respectively, are obtained for the difference between each value to be calculated. Assuming that the waveform f approximately conforms to a stroke waveform a, the difference corresponds to the drive distance L of the armature 3. In other words, the distance L can be expressed below by using a correction coefficient $\epsilon$:

$$L = \epsilon^*(f_{t=T4} - f_{t=T6}) \quad (17).$$

Since the drive distance L of the armature 3 has a value almost constant in switchgears with the same shape, calculating the difference between the values of the waveform f allows the correction coefficient $\epsilon$ to be obtained below:

Formula 5

$$\varepsilon = \frac{L}{(f_{t=T6} - f_{t=T4})} \quad (18)$$

Using the correction coefficient $\epsilon$, the waveform f is further modified to obtain a new calculated waveform $F_i$ as shown below:

$$F_i = \epsilon^*(-c_i - \beta I_i) \quad (19).$$

In the third procedure, from the difference between values of the waveform F at the time point T5 and T5+ΔT7, velocity v of driving the armature 3 during the opening operation is calculated:

Formula 6

$$v = \frac{F_{t=T5+\Delta T7} - F_{t=T5}}{\Delta T7}, \quad (20)$$

where ΔT7 is a predetermined fixed value.

While the velocity is here calculated with respect to the wipe-completion time point T5, the velocity may be calculated with respect to a specific time point or a specific value of the waveform F.

In the fourth procedure, the velocity v is compared with predetermined lower and upper limit velocity values. When the velocity falls below the lower limit value or exceeds the upper limit value, such situation is determined to be a velocity anomaly, and an anomaly-determination signal is output to an external device.

Similarly also for the closing operation, calculation of velocity of driving the armature 3, which velocity is a parameter indicating a condition of the switchgear, and condition determination can be performed from the calculated waveforms g and h shown in FIG. 10. Although the wipe-completion time point T5 is difficult to find from the calculated waveforms g and h shown in FIG. 10, by detecting a start point T4 and completion point T6 of driving the armature 3, correction coefficients t and u for the waveforms g and h, respectively, can be calculated in much the same way as the opening operation:

Formula 7

$$t = \frac{L}{(g_{t=T6} - g_{t=T4})} \quad (21)$$

$$u = \frac{L}{(h_{t=T6} - h_{t=T4})}. \quad (22)$$

Using the correction coefficients t and u, new waveforms G and H are calculated as follows:

$$G_i = t^*(b_i - \gamma^* I_i) \quad (23)$$

$$H_i = u^*(-c_i - \delta^* I_i) \quad (24).$$

The velocity during the closing can thereby be calculated with respect to a specific time or a specific value of the waveform F from the new waveforms G and H.

The obtained velocity is compared with predetermined lower and upper limit velocity values, which are generally different from values for the opening. When the velocity falls below the lower limit value or exceeds the upper limit value, such situation is determined to be a velocity anomaly, and an anomaly-determination signal is output to the external device.

Decrease in velocity of driving the armature 3 during an opening operation involves decrease in velocity of driving the moving contact coupled to the armature 3 via the wipe spring, resulting in reduction of current interruption performance of the power switchgear at the opening operation. Namely, even though the contact has been opened, an arc current continues to flow, so that the current cannot be interrupted even in a situation for power to be interrupted at the occurrence of a fault, resulting in propagation of the fault. Hence, when decrease of the velocity is detected, maintenance needs to be immediately performed.

Decrease in velocity of driving the armature 3 during a closing operation may cause melt-adhesion of the electrodes by an arc generated at the closing operation, so that an opening operation could be impossible to perform afterward. This case also requires urgent maintenance.

Moreover, in both opening and closing operations, decrease in the driving velocity arises from increase of mechanical friction force in the actuating mechanism, shortage of driving current, or the like, and is conceivable to be a sign of some anomalies in the device. Since these anomalies probably lead to a malfunction of the actuating mechanism, maintenance also needs to be performed.

Furthermore, when velocity of driving the armature 3 is higher than the predetermined value, a mechanical impact at completion of the actuation becomes larger, which lead to be a factor responsible for shortening endurance time of the switchgear. Hence, when an overspeed is detected, a remedy can be performed, such as earlier implementation of regular maintenance or a review of endurance time of the device.

In the above embodiment, an example is described in which velocity in both opening and closing operation is monitored. If the mechanical friction force is assumed the same degree in the opening and closing operations, by watching velocity only during one of the operations, condition in the other operation could be presumed the same. However, the opening and closing operations are in most cases electrically independent from each other, and hence, extraordinary friction force may probably be generated in only either one of the opening or closing operation. Moreover, reference velocity values for the opening and closing operations may be different from each other. For such reasons, it is preferable to monitor both operations.

As described above, according to the embodiment, velocity of driving an armature can be acquired from calculated waveforms obtained by performing a calculation using a magnetic-flux waveform and a current waveform, so that a condition of the actuator, that of the moving contact operated thereby, or that of the switchgear can be monitored by using the driving velocity. Therefore, a compact and high-accuracy condition-monitoring device can be obtained at low cost.

When the current sensor 7 and the magnetic-flux sensors 6a and 6b vary in their sensitivities, for example, when the outputs of these sensors, defining their sensitivity ratios as p, q, and r, respectively, vary as follows:

$$I_i \rightarrow p^* I_i$$

$$b_i \rightarrow q^* b_i$$

$$c_i \rightarrow r^* c_i,$$

the waveform F varies below:

$$F_i = \epsilon^*(-r\, c_i - \beta^* p^* I_i) \quad (25).$$

The above formula can be arranged below:

$$F_i = \epsilon_1^*(-c_i - \beta_1^* I_i) \quad (26).$$

Coefficients $\beta_1$ and $\epsilon_1$ is determined under only two conditions that a flat region appears before the time point when the armature 3 begins to move and that the drive distance thereof is L. Accordingly, even when the sensor sensitivities vary their variations are absorbed in the coefficient $\beta_1$ and the correction coefficient $\epsilon_1$ at determining the coefficients. For that reason, the same result can always be obtained. As also for the coefficients $\alpha$, $\gamma$, and $\delta$, and the correction coefficients t and u for the waveforms e, g, h, G, and H, respectively, since their variations are absorbed in these coefficients at determining them, the same result can always be obtained.

Accordingly, using a condition-monitoring device according to the embodiment eliminates initial calibration of a current sensor and magnetic sensors as well as influences of temporal variations thereof. Therefore, it is possible to perform a high-accuracy condition determination even using low-cost sensors.

Figure 12:
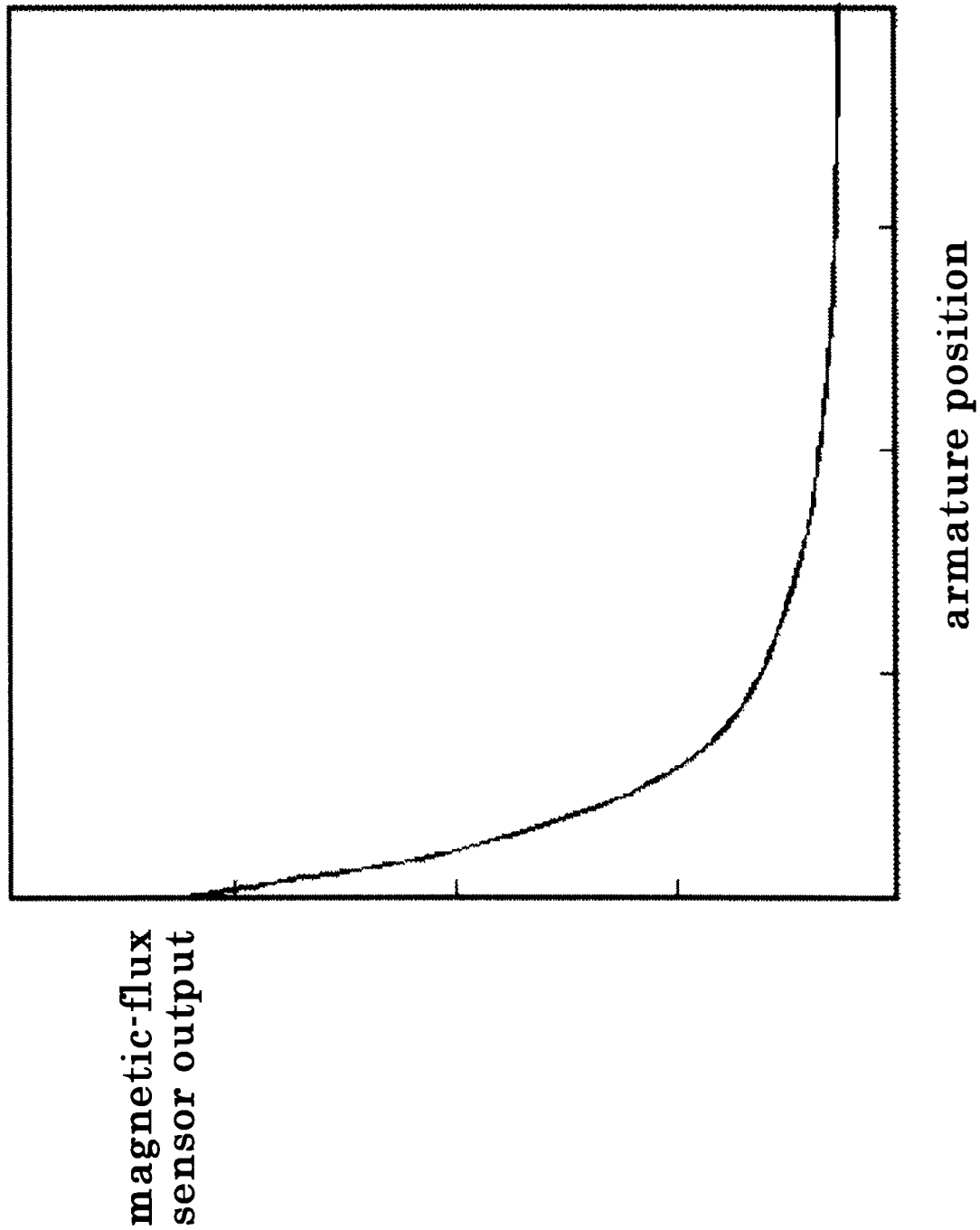
FIG. 12 is a graph illustrating an example of a relation between positions of the armature and an output of one of the magnetic-flux sensors, in Embodiment 1 of the invention Embodiment 1 of the invention.

In addition, there is a non-linear correlative relation between magnetic flux produced by the permanent magnet and positions of the armature 3, for example, a relation may sometimes be represented as shown in FIG. 12. In a case of such non-linear correlative relation, even though the armature 3 moves, for example, at a constant speed from beginning to end, velocity calculated based on, for example, the waveform F, is measured as if the velocity were low near the completion point of movement of the armature 3, compared with velocity measured near the starting point thereof.

Accordingly, even when a velocity is measured at a specific reference point such as the wipe completion point, the velocity can be converted to its accurate velocity by using a velocity-correction coefficient z with respect to the reference point.

It is noted that defining a normal range of velocity with reference to a measured value eliminates introduction of such velocity-correction coefficient.

When accurate velocity need to be calculated over the entire region, a velocity-correction coefficient according to the waveform F is required. To be more specific, when there is a relational expression or an approximate relational expression between the magnet sensor output b and positions x of the armature 3 as shown below:

$$x = Y(b) \quad (27),$$

using the following relation:

Formula 8

$$v = \frac{dx}{dt} = \frac{\partial Y}{\partial b} \cdot \frac{db}{dt} \quad (28)$$

where db/dt is a value corresponding to a velocity calculated from the waveform F, the following formula may be defined as a velocity correction function.

Formula 9

$$z(b) = \frac{\partial Y}{\partial b} \quad (29)$$

When an approximate expression between x and b is difficult to create, a method can be employed in which discrete velocity-correction coefficient data $\gamma_j$ is created from the correlative relation between x and b and stored in the memory 22 as a database, to use the database in the memory at the velocity calculation.

While the above describes the case of using the velocity of driving the armature 3 as a condition value, a coil current value at the starting point of movement thereof can also be used as another condition parameter. In addition, both the coil current value at the starting point thereof and the velocity may be used. In a case of using the coil current value at the starting point of the movement, similarly to the method using the velocity, the calculated waveforms e, f, g, and h are derived and starting points of the movement on each waveform are calculated. When the current value at the point falls below a predetermined lower limit or exceeds a predetermined upper limit, the condition is determined to be an anomaly, and the anomaly determination is output externally.

The starting time point of movement of the armature 3 is just a point where the force holding the armature 3 is balanced on the electromagnetic force by the coil. Accordingly, the force holding the armature 3 can be determined from the current value at the starting point of the movement.

Decrease in the current value at the starting point of the movement, which indicates decrease in the holding force, may arise from an anomaly on the contact surface or demagnetization of the permanent magnet, resulting in causing malfunctions of the switch gear.

Carrying out maintenance of the actuating mechanism by detecting a sign of decreasing the holding force allows the switchgear to be prevented from malfunctions.

Meanwhile, increase in the current value at the starting point of the movement indicates increase in the holding force on the armature 3. Temporal increase of the holding force may be considered due to increase in static friction force. Since increase in static friction force become a cause leading to malfunctions of the actuator, by determining a sign of static friction force increasing over a reference value, malfunctions of the switchgear can be prevented from occurring by carrying out maintenance before a failure occurs.

In the above embodiment, an example has been described in which by obtaining the calculated waveforms e and f in the opening operation and the calculated waveforms g and h in the closing operation, velocity of the armature in the opening operation are calculated from the calculated waveform f using distinctive points obtained from the waveform e, and velocity of the armature in the closing operation are calculated from the calculated waveforms g and h using distinctive points obtained therefrom. However, only one of the calculated waveforms e, f g, and h may be used for calculating the velocity.

In addition, by calculating velocity of the armature in the opening or closing operation, or a current value at the beginning of armature movement using a plurality of such waveforms, condition of the switchgear may be monitored based on the calculated velocity or the calculated current value.

In addition, in the above embodiment, in calculating the calculated waveforms e, f, g, and h from magnetic-flux waveforms and a current waveform, the calculation formulas are used that is expressed by linear combination of the magnetic-flux waveforms and the current waveform with the calculation coefficients $\alpha$, $\beta$, $\gamma$, and $\delta$. However, the calculated waveforms may be calculated using a theoretically derived calculation formula.

For example, the calculation formulas can be created based on the formula (4):

$$\phi_{6a}(t)=\phi_{PM\_6a}(x)*(1+k_1*k_2*I)$$

or on the following relational expression derived from the formulas (1) and (2):

$$\phi_{6a}(t)=\phi_{PM\_6a}(x)+\Phi_{PM\_6a}(x)*k_1*I \quad (30).$$

Embodiment 2

Figure 13:
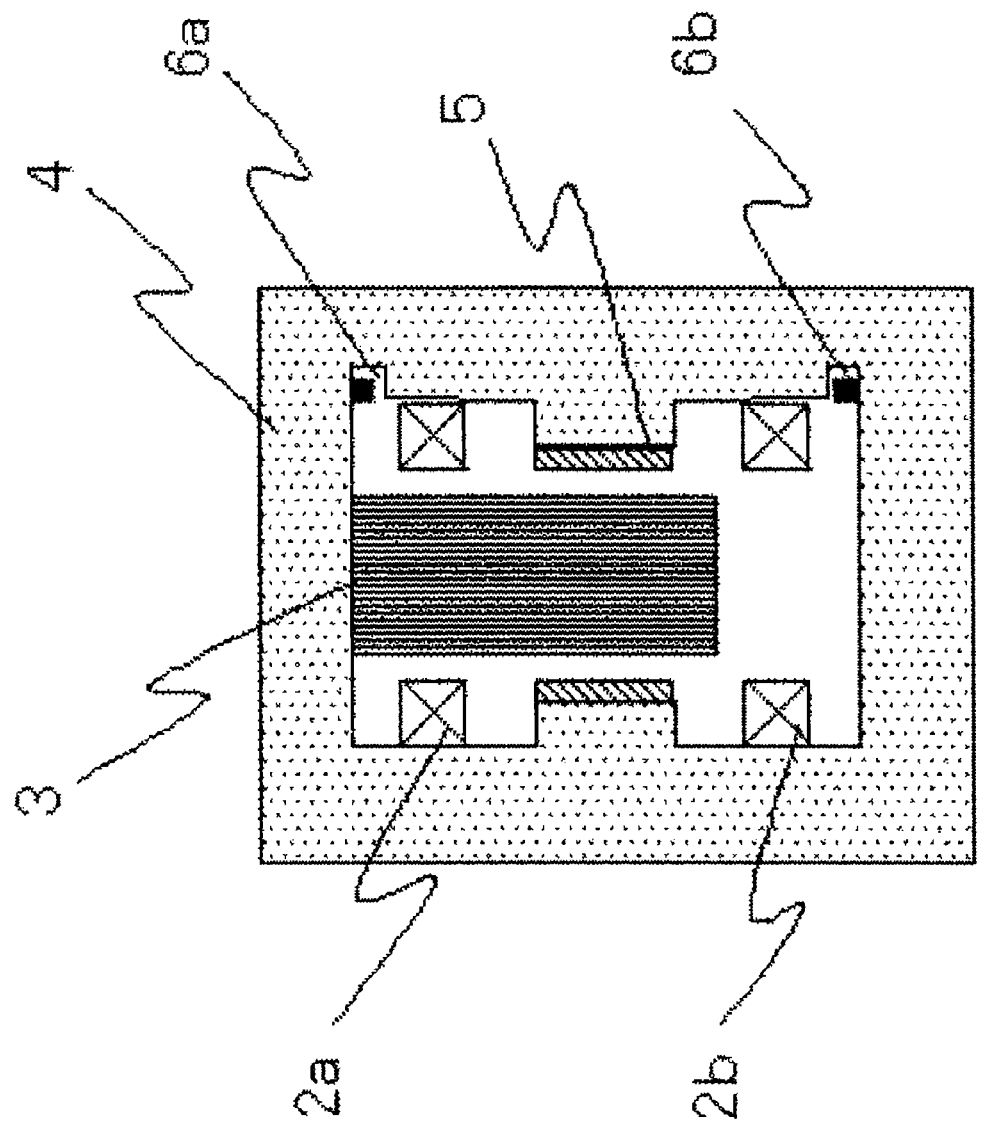
FIG. 13 is a schematic view illustrating a configuration of an electromagnetic actuating mechanism (the "CLOSED" state) according to Embodiment 2 of the invention.

FIG. 13 is a configuration view ("CLOSED" state) illustrating an electromagnetic actuator according to Embodiment 2 of the invention. Grooves are cut in the inner surface of a yoke 4, for magnetic-flux sensors 6a and 6b to be attached in the grooves.

Comparing with the configuration of Embodiment 1 shown in FIG. 3B, the electromagnetic actuator can be manufactured at low cost because of no need to drill in the yoke 4.

Embodiment 3

Figure 14:
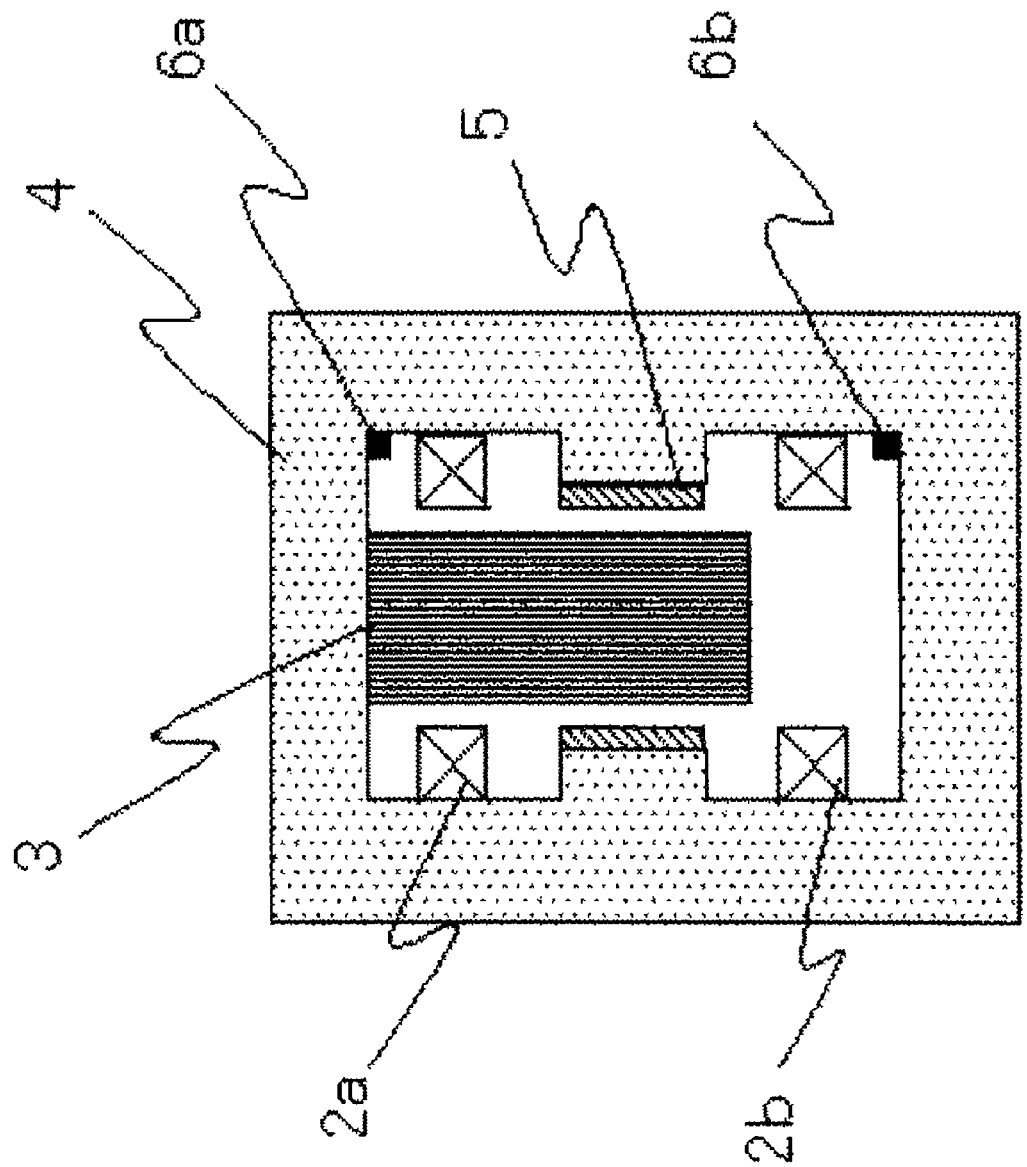
FIG. 14 is a schematic view illustrating a configuration of an electromagnetic actuating mechanism (the "CLOSED" state) according to Embodiment 3 of the invention.

FIG. 14 is a configuration view ("CLOSED" state) illustrating an electromagnetic actuator according to Embodiment 3 of the invention. Magnetic-flux sensors 6a and 6b are fixed in such a way as to stick on the inner surface of a yoke 4.

By sticking the sensors on the portions such as corners of the yoke 4 where magnetic flux is likely to saturate, measurement values can be obtained corresponding to magnetic flux inside the yoke 4.

The electromagnetic actuator can be thereby manufactured at a low cost because of no need to drill in the yoke 4.

Embodiment 4

Figure 15:
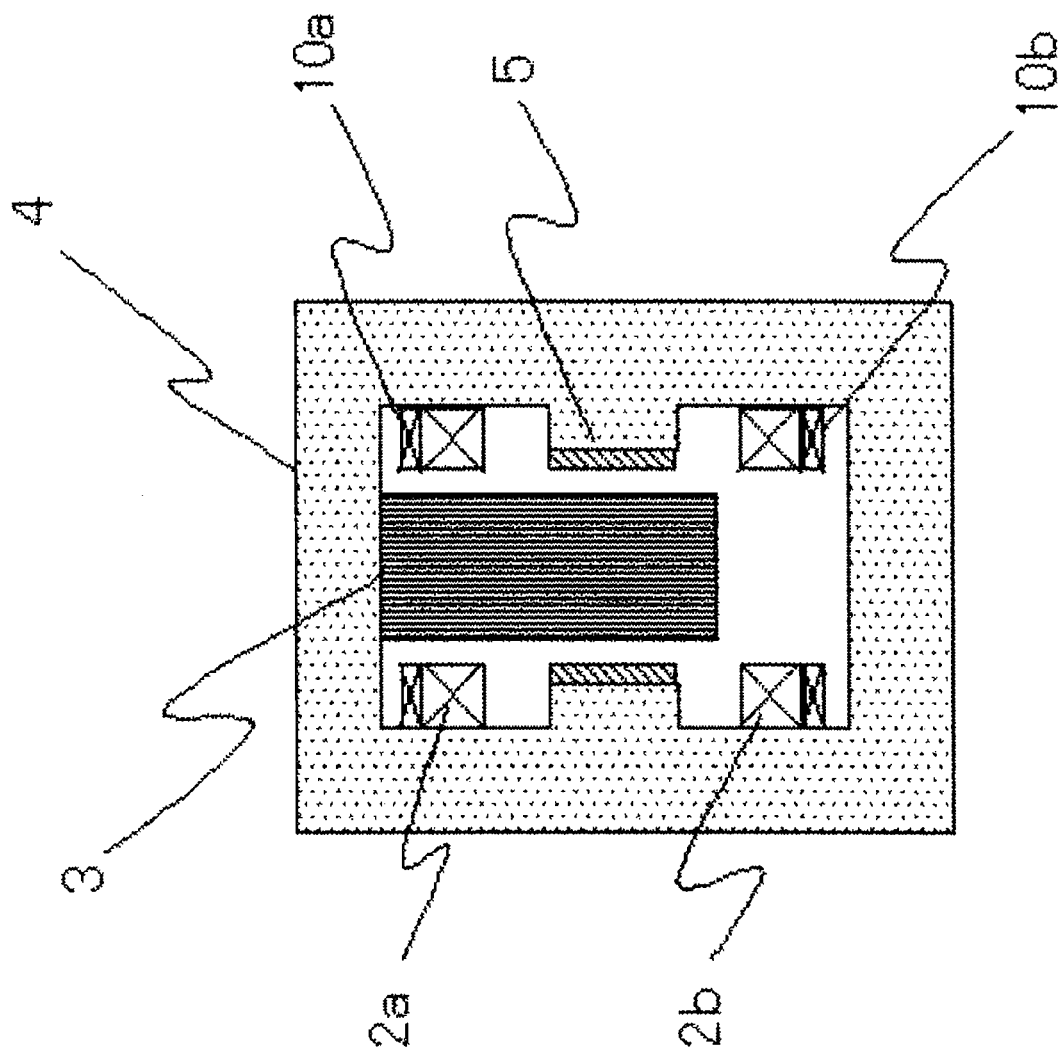
FIG. 15 is a schematic view illustrating a configuration of an electromagnetic actuating mechanism (the "CLOSED" state) according to Embodiment 4 of the invention.

FIG. 15 is a configuration view ("CLOSED" state) illustrating an electromagnetic actuator according to Embodiment 4 of the invention.

The electromagnetic actuator is configured in such a manner that search coils 10a and 10b are wound on coils 2a and 2b, respectively, to obtain output signals proportional to the rate of change in magnetic flux penetrating through the search coils 10a and 10b.

The magnetic flux penetrating through the search coils 10a and 10b is determined by integrating each output signal, whereby outputs corresponding to those from the magnetic sensors 6a and 6b inserted inside the yoke 4 can be obtained.

Embodiment 5

Figure 16:
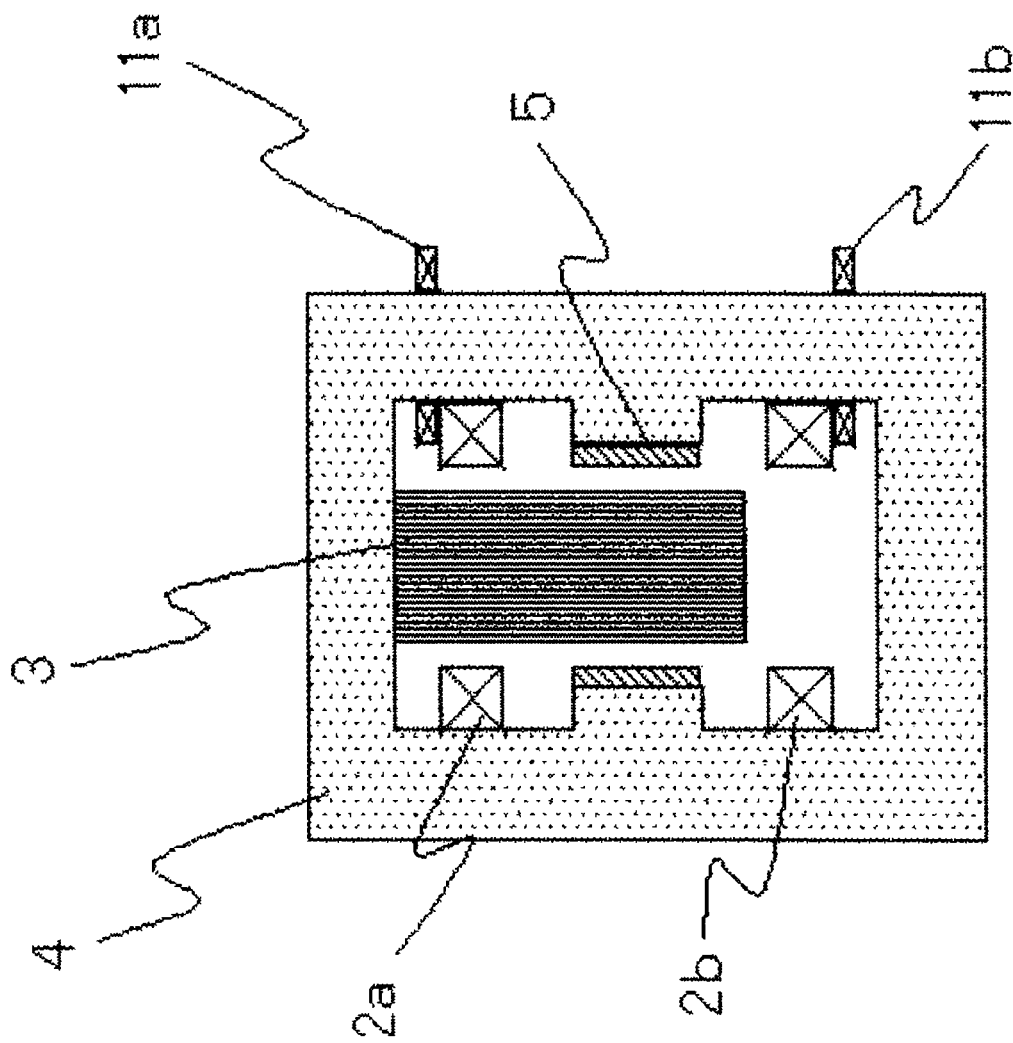
FIG. 16 is a schematic view illustrating a configuration of an electromagnetic actuating mechanism (the "CLOSED" state) according to Embodiment 5 of the invention.

FIG. 16 is a configuration view ("CLOSED" state) illustrating an electromagnetic actuator according to Embodiment 6 of the invention. Search coils 11a and 11b are configured in such a manner as to be wound around a yoke 4, to obtain output signals proportional to the rate of change in magnetic flux penetrating through the search coils 11a and 11b.

The magnetic flux penetrating through the search coils 11a and 11b is determined by integrating each output signal, whereby outputs corresponding to those from the magnetic sensors 6a and 6b inserted inside the yoke 4 can be obtained.

Embodiment 6

Figure 17:
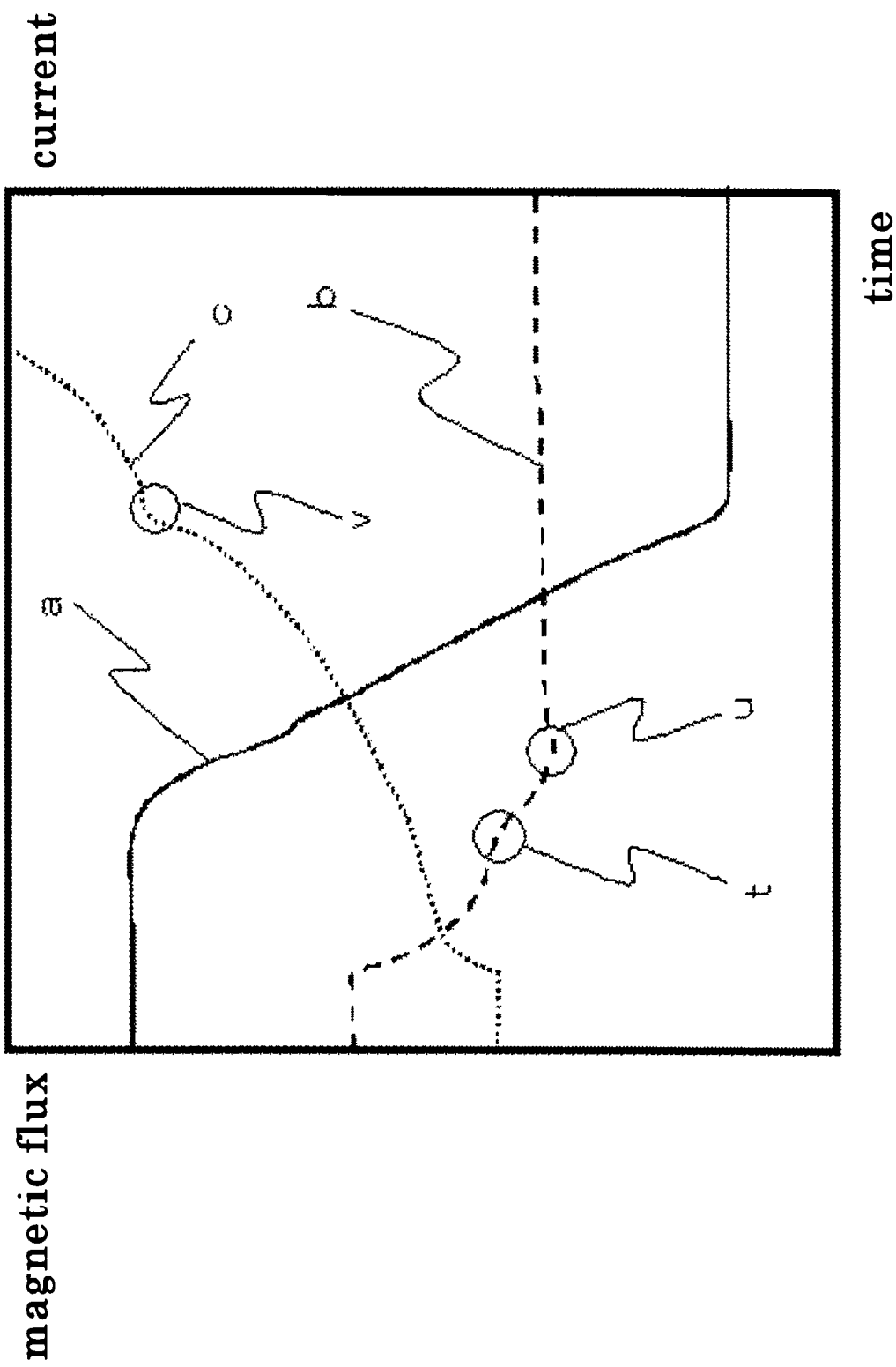
FIG. 17 illustrates characteristic graphs of positions of the armature and an output of one of the magnetic-flux sensor, when the armature travels from the "CLOSED" state to the "OPEN" state, in Embodiment 6 of the invention.

While, in each embodiment described above, condition of the switchgear is determined by performing the calculation using the magnetic-flux waveforms and the current waveform, it can also be determined directly from magnetic waveforms. In FIG. 17, such points as those at t and u on a magnetic-flux-sensor output waveform b and a point at v on a magnetic-flux-sensor output waveform c, where curvature of the waveforms distinctly varies, are coincident with the starting point, the wipe completion point, and the movement completion point of the armature, respectively.

Since the distinctive time points can thus be found easily by observing only signals from the magnetic-flux sensors, condition of the switchgear can be estimated from information on the points.

To be more specific, by finding time points where curvature of the magnetic-flux-sensor output waveforms b and c distinctly varies as distinctive points, condition of the switchgear can be estimated depending on whether or not time intervals between the distinctive points deviate from respective normal values.

Embodiment 7

Figure 18:
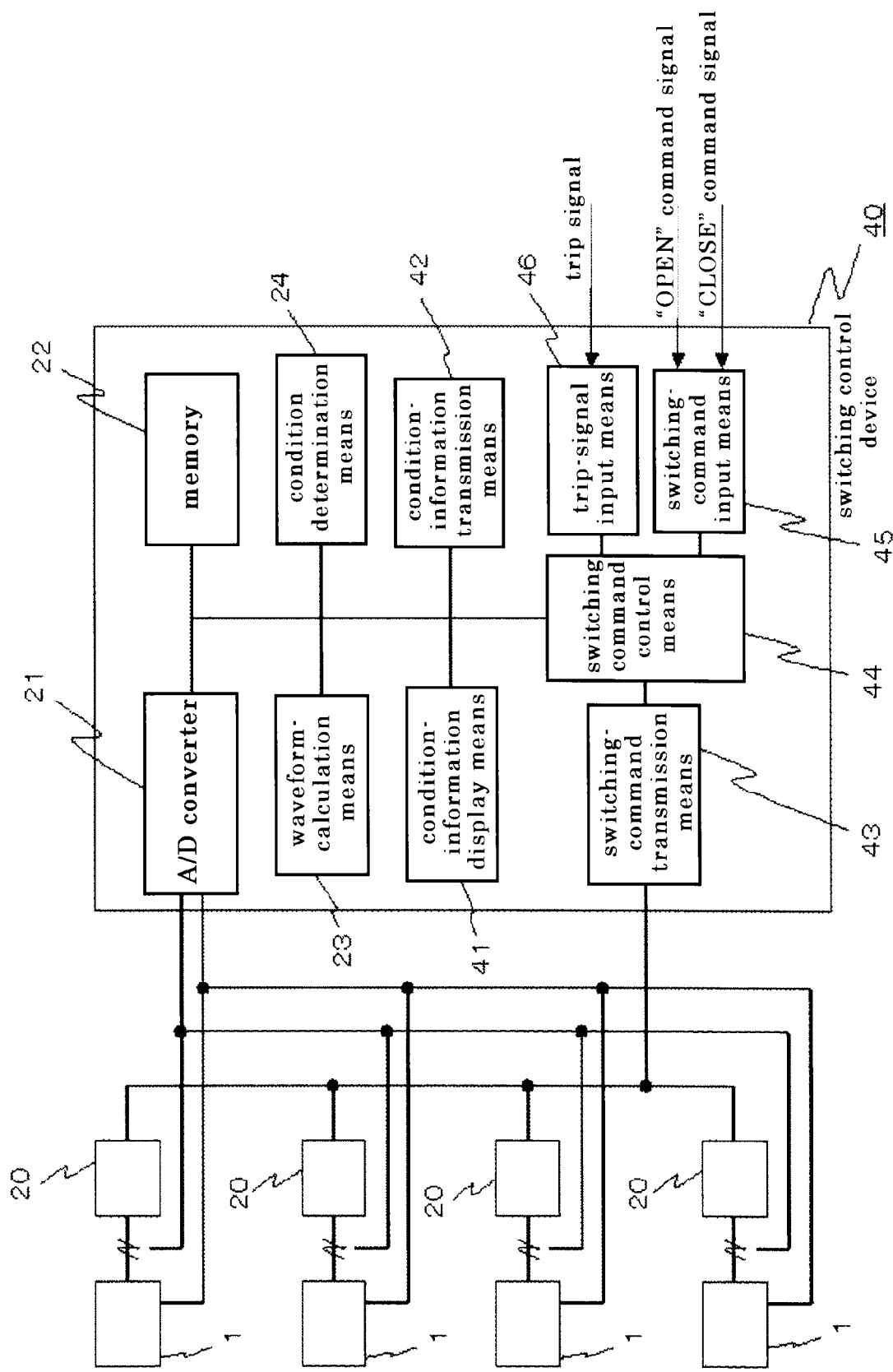
FIG. 18 is a block diagram illustrating a configuration of a switch-control device according to Embodiment 7 of the invention.

FIG. 18 is a block diagram illustrating a configuration of a switch-control device according to Embodiment 7 of the invention. A switch-control device 40 is provided with a waveform acquisition means (A/D converter) 21, a storage means (memory) 22, a waveform calculation means 23, a condition determination means 24, a condition-information display means 41, a condition-information transmission means 42, a switching-command transmission means 43, a switching-command control means 44, a switching-command input means 45, and a trip-signal input means 46.

The configuration is made in such a manner that an "OPEN" command or a "CLOSE" command can be transmitted from the switching-command transmission means 43 to at least one of a plurality of drive power-supplies 20. The switching-command input means 45 receives from an external controller an "OPEN" command signal or a "CLOSE" command signal for each of the drive power-supplies. The switching-command control means 44 commands the switching-command transmission means 43 to transmit the switching-command therefrom to each of the drive power-supplies 20 in response to the switching-command signal having been input into the switching-command input means 45. The switching-command control means 44 also commands the waveform acquisition means 21 to start an A/D-conversion at the same time when the switching command is transmitted or after a certain time elapses from the transmission. The drive power-supplies 20 energize coils 2 in actuators 1 for a certain time after receiving the switching command.

The waveform acquisition means 21 reads values of coil currents energizing the actuators 1 from the drive power-supplies 20 and signals from magnetic-flux sensors (not shown) built in the actuators 1, and repeats the A/D-conversion of the values read at a constant sampling interval. After repeating the conversion just for predetermined times of sampling or for a predetermined time, the acquisition means completes the A/D-conversion and stores into the memory 22 magnetic-flux waveform data and current waveform data both having been acquired.

After completion of the A/D-conversion, the waveform calculation means 23 performs a calculation process using the magnetic-flux waveform data and the current waveform data, to store the calculated waveform data into the memory 22.

After completion of the waveform calculation process, the condition determination means 24 reads the calculated waveform data having been stored in the memory 22, to calculate condition parameters such as velocity of driving the armature 3, holding force of the actuator, and static friction force in the actuator. Then, the degree of failure is determined by comparing the condition parameters with respective reference values stored beforehand in the memory 22. Namely, a major failure condition that requires urgent maintenance, a minor failure condition that requires advancing of a maintenance period, or the normal condition is determined, and the result of the determination is stored into the memory 22.

The condition display means 41 performs, based on the determination result of the condition determination means 22, a display according to the degree of failure by LED lighting or a display monitor.

The condition-information transmission means 42 transmits condition information to the external controller via a contact signal, RS-422, or a network function.

The switching-command control means 44, when receiving a next switching-command, determines, based on the condition determination result, whether or not the switching command should be sent to the switching-command transmission means 43. In other words, the control means 44 forbids the transmission means 43 from transmitting the switching-command to an actuator that was determined to be in a major failure at the previous operation.

By performing such switching control, a fault due to a malfunction of a switchgear can be prevented from occurring.

Note that, when the trip-signal reception means 46 receives a trip signal, the switching-command control means 44 commands the switching-command transmission means 43 to transmit the "OPEN" command, regardless of whether the failure is in a major failure state or not This is because, when a fault occurs in an electric power apparatus, priority is put on isolation of the fault.

In addition, when receiving a trip signal for a switchgear that is in a major failure state, the switching control device 44 controls to send a trip signal or an "OPEN" command to a switchgear in the higher hierarchy. Thereby, the fault can be prevented from propagating.

What is claimed is:

1. A system comprising: a condition-monitoring device provided with an electromagnetic actuator including a stationary core, a moving core configured to be movable with respect to the stationary core, magnet coils energized by a drive power-supply, for moving the moving core, and a permanent magnet disposed around the moving core, said the condition-monitoring device for monitoring conditions of the electromagnetic actuator comprising:
   a current measurement means for measuring a current flowing through the magnet coils;
   magnetic-flux measurement means for measuring magnetic flux inside the stationary core;
   a calculation means for generating a calculated waveform by performing a calculation using a current waveform representing a time variation of an output signal from the current measurement means and a magnetic-flux waveform representing a time variation of an output signal from the magnetic-flux measurement means; and
   a condition determination means, by finding a distinctive point on the calculated waveform, for determining conditions of the electromagnetic actuator, based on information on the distinctive point.

2. The system as recited in claim 1, wherein the calculation means generates a calculated waveform using a calculation formula expressed by a linear combination of the magnetic-flux waveform and the current waveform with calculation coefficients.

3. The system as recited in claim 2, wherein the calculation means determines the calculation formula by finding the calculation coefficients on condition that the calculated waveform has a flat region before the moving core starts to move.

4. The system as recited in claim 1, wherein the condition determination means, by calculating velocity of driving the moving core using information on the distinctive point on the calculated waveform, determines a condition of the electromagnetic actuator, based on the driving velocity.

5. The system as recited in claim 4, wherein the condition determination means, when there is a non-linear correlative relation between magnetic flux produced by the permanent magnet and positions of the moving core, by finding a velocity-correction function based on the correlative relation, corrects the driving velocity at the distinctive point using the velocity-correction function.

6. The system as recited in claim 1, wherein the condition determination means, by finding a starting point of the moving core from the distinctive point on the calculated waveform, determines a condition of the electromagnetic actuator, based on a current value at the starting point.

7. A switch-control device, comprising a condition-monitoring device as recited in claim 1, which determines a degree of failure on the basis of a condition of an electromagnetic actuator obtained by the condition-monitoring device, to perform a display according to the degree of failure, and to control a switching operation of the electromagnetic actuator at the occurrence of a major failure.

* * * * *